(12) United States Patent
Nakashima et al.

(10) Patent No.: US 6,661,234 B2
(45) Date of Patent: Dec. 9, 2003

(54) FAILURE DETERMINING APPARATUS OF GAS-INSULATED ELECTRICAL APPLIANCE

(75) Inventors: Kuniaki Nakashima, Tokyo (JP); Hiroshi Doi, Tokyo (JP); Yasuhiro Maeda, Tokyo (JP); Hirohide Aoki, Tokyo (JP); Hiroyuki Hama, Tokyo (JP); Naoyuki Kajita, Tokyo (JP); Yoshikatsu Honda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/756,216

(22) Filed: Jan. 9, 2001

(65) Prior Publication Data

US 2001/0017262 A1 Aug. 30, 2001

(30) Foreign Application Priority Data

Feb. 28, 2000 (JP) .......................... 2000-051911
Jul. 6, 2000 (JP) .......................... 2000-204814

(51) Int. Cl.$^7$ .......................... G01L 21/30; G01N 27/62; G01R 31/08
(52) U.S. Cl. .......................... 324/514; 324/460; 324/464
(58) Field of Search .......................... 702/140, 185; 73/152.52, 716, 714; 324/460, 464, 514

(56) References Cited

U.S. PATENT DOCUMENTS 5,876,578 A    3/1999   Yamauchi et al. .......... 204/424

FOREIGN PATENT DOCUMENTS

| EP | 0 621 489 A2 | 10/1994 |
| EP | 0716489 A2 | 6/1996 |
| JP | 02159580 | 6/1990 |
| JP | 5-188024 | 7/1993 |
| JP | 06-222104 | * 8/1994 |
| JP | 7-241009 | 9/1995 |
| JP | 8-271477 | 10/1996 |
| JP | 09163529 | 6/1997 |
| JP | 10-26602 | 1/1998 |
| JP | 10324114 | 9/1998 |
| WO | WO 97/28587 A1 | 8/1997 |

* cited by examiner

Primary Examiner—N. Le
Assistant Examiner—John Teresinski
(74) Attorney, Agent, or Firm—Sughrue Mion, PLLC

(57) ABSTRACT

A failure determining apparatus for a gas-insulated electrical appliance where the appliance is a cylindrical metal container with a charged conductor, insulating gas, and a plurality of insulating spaces inside for supporting the conductor and partitioning the container. The failure determining apparatus has a high-speed developing sensor which detects a high-speed phenomenon caused by a failure within the gas sections; a first failure determining circuit which determines the presence of a failure from an output of the high-speed developing sensor; a low-speed developing sensor which detects a low-speed phenomenon caused by a failure within the gas sections; a second failure determining circuit which determines the presence of a failure from an output of the low-speed developing sensor; and an arithmetic control circuit which identifies a gas section of the metal container in which a failure occurs from an output of the first and second failure determining circuits.

27 Claims, 18 Drawing Sheets

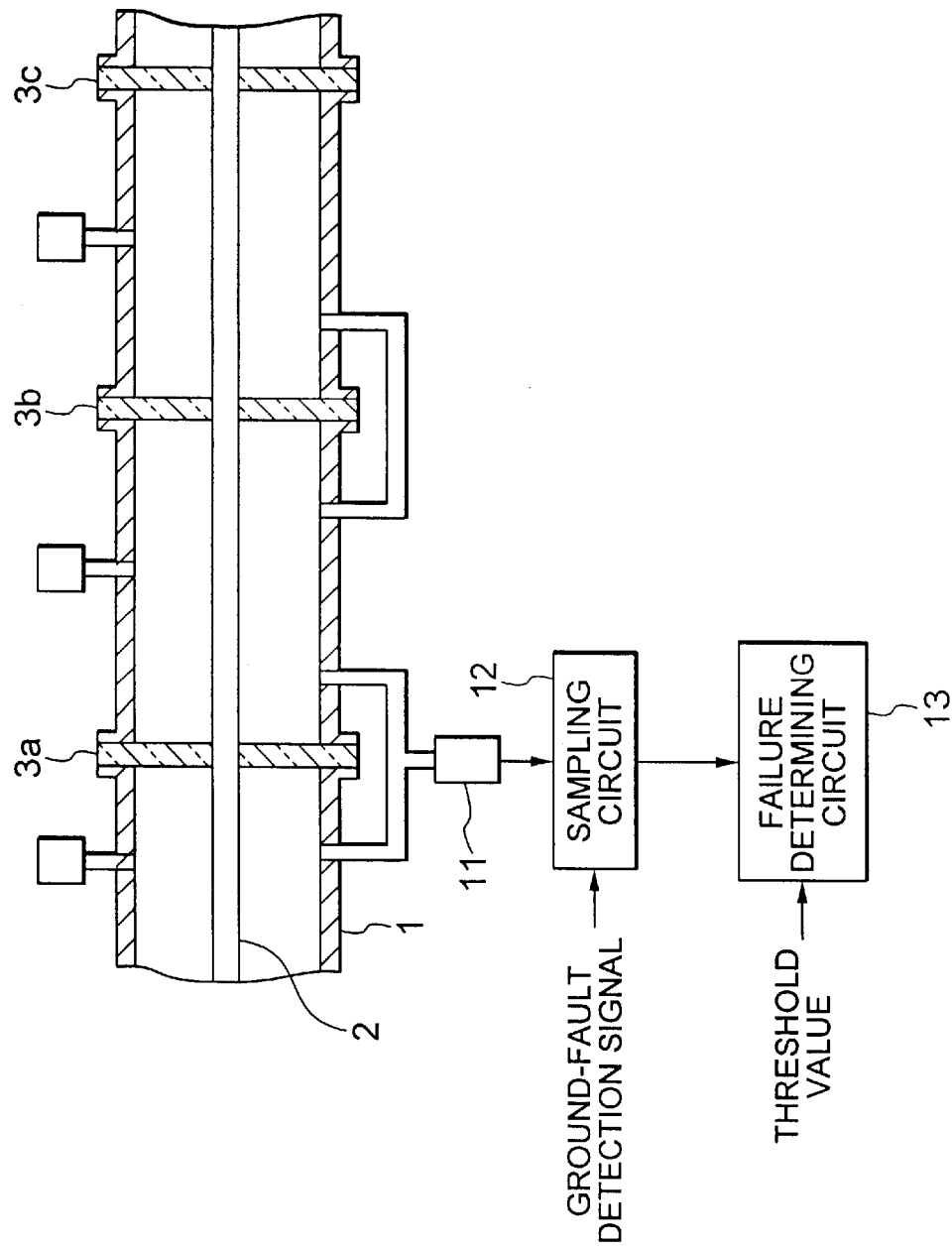

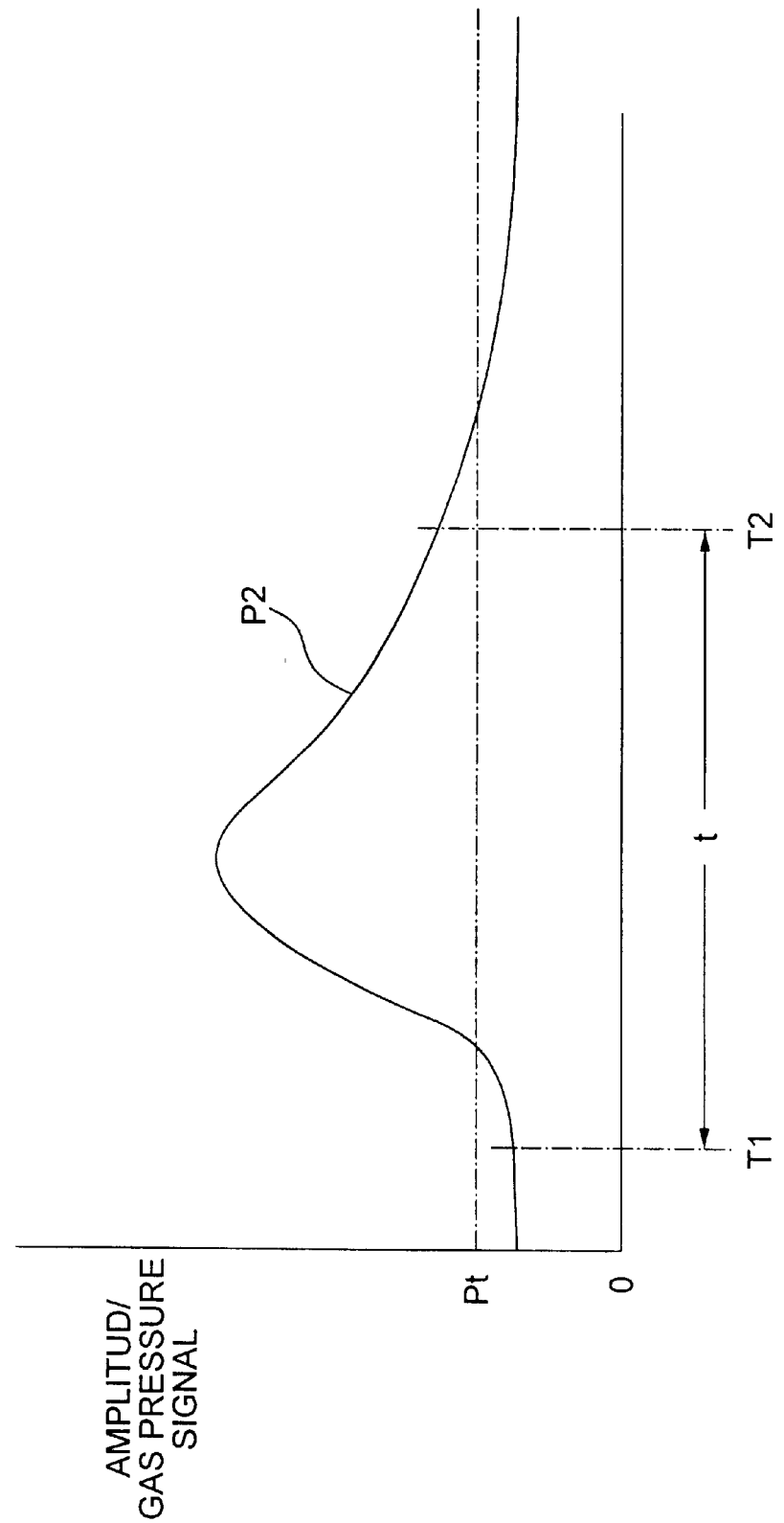

FAILURE DETERMINING APPARATUS OF GAS-INSULATED ELECTRICAL APPLIANCE

BACKGROUND OF THE INVENTION

1. Field of the Invention

The present invention relates to a failure determining apparatus of a gas-insulated electrical appliance, which determines presence or absence of ground-fault or short-circuit of a charged conductor in a gas section, by detecting a change in the gas pressure in the gas section forming the gas-insulated electrical appliance.

2. Description of the Related Art

A gas-insulated electrical appliance has a cylindrical metal container housing therein a charged conductor corresponding to a single phase or three phases. The former has a risk of suffering from a ground-fault of the charged conductor to the metal container, and the latter, ground-fault of charged conductor of each phase to the metal container and short-circuit between the charged conductors of different phases. Since these inconveniences are similarly covered by the present invention, only the former case will herein be described.

A conventional failure determining apparatus of a gas-insulated electrical appliance will first be described with reference to the drawings. FIG. 17 illustrates the configuration of the conventional failure determining apparatus of a gas-insulated electrical appliance.

In FIG. 17, 1 represents a cylindrical metal container to be filled with an insulating gas; 2, a charged conductor housed in the metal container 1; and 3a, 3b and 3c, insulating spacers partitioning the metal container 1 into gas sections and insulation-supporting the charged conductor 2.

Also in FIG. 17, 11 represents a gas pressure detector detecting a gas pressure signal corresponding to a gas pressure of a gas section for comprehensive control through communicating piping, attached to the metal container 1; 12, a sampling circuit sampling a gas pressure signal issued by the gas pressure detector 11 after the lapse of a prescribed period of time by input of a ground-fault current detection signal from outside; 13, a failure determining circuit which determines occurrence of a ground-fault if a sampled gas pressure is larger than a threshold value through comparison of the gas pressure signal sampled at the sampling circuit 12 and the threshold value.

Operations of the conventional failure determining apparatus of a gas-insulated electrical appliance will now be described with reference to the drawings. FIG. 18 is a waveform diagram showing a gas pressure signal detected by the gas pressure detector of the conventional failure determining apparatus of a gas-insulated electrical appliance.

For one of the gas sections formed by partitioning the metal container 1 by means of insulating spacers 3a and 3b under comprehensive control through a communicating piping, when a ground-fault occurs between the charged conductor 2 and the metal container 1, the pressure of the insulating gas in this gas section suddenly increases near the arc, leading to production of a pressure wave. The gas pressure detector 11 detects a gas pressure signal based on superposition of a gas dynamic pressure signal corresponding to a dynamic pressure of the insulating gas of this pressure wave on a gas state pressure signal corresponding to the static pressure of an auxiliary gas filling the neighboring gas section connected by the communicating piping.

This gas pressure signal and a ground-fault current detection signal from outside after the lapse of a prescribed period of time from the occurrence of the ground-fault are entered into the sampling circuit 12. Therefore, the gas pressure signal P2 at the point in time T2 when a prescribed period of time t from the point in time T1 when this ground-fault current detection signal has been entered is sampled (see FIG. 18).

In the failure determining circuit 13, occurrence of a ground-fault is determined if the sampled gas pressure signal P2 is larger (the gas pressure signal P2 is larger in FIG. 18).

Although not shown in FIG. 17, the gas pressure detector 11 is attached to the metal container 1, also for the other gas sections, to determine occurrence of a ground fault by connecting the same to the sampling circuit and the failure determining circuit.

In the conventional failure determining apparatus of a gas-insulated electrical appliance, as described above, the gas pressure signal P2 is sampled at the point in time T2 upon the lapse of the prescribed period of time t from the point in time T1 of input of the ground-fault current detection signal, on the assumption that the gas pressure signal detecting by the gas pressure detector 11 takes substantially the shape shown in FIG. 18. The sampled signal is compared with a prescribed threshold value Pt, and if the gas pressure signal P2 is larger, occurrence of a ground-fault is determined. However, the increase in gas pressure may differ from that shown in FIG. 18 under the effect of the size of the metal container 1 arranged between the insulating spacers 3a and 3b, the arc energy upon occurrence of the ground-fault, or the duration of the ground-fault. Because a threshold value cannot be primarily set, a problem is encountered in that the presence of occurrence of a ground-fault cannot accurately be determined.

SUMMARY OF THE INVENTION

The present invention was developed to solve the above-mentioned problems, and has an object to provide a failure determining apparatus of a gas-insulated electrical appliance, which permits improvement of certainty of determination through a combination of sensors of different types for the purpose of accurately identifying a gas section in which a ground-fault occurs without being affected by conditions upon occurrence of the ground-fault such as structural restrictions including the interval between the insulating spacers, the arc energy produced upon occurrence of the ground-fault, and the duration, thus permitting reduction of the trouble eliminating operations upon occurrence of an accident.

The failure determining apparatus of a gas-insulated electrical appliance of a first aspect of the present invention determining a failure, having a cylindrical metal container, a charged conductor housed in the metal container filled with an insulating gas, and a plurality of insulating spacers insulation-supporting the charged conductor from the metal container and partitioning the interior of the metal container into gas sections, comprises a high-speed developing sensor which detects a high-speed phenomenon caused by a failure such as a ground-fault or a short-circuit within the gas sections; a first failure determining circuit which determines the presence of a failure from an output of the high-speed developing sensor; a low-speed developing sensor which detects a low-speed phenomenon caused by a failure such as a ground-fault or a short-circuit within the gas sections; a second failure determining circuit which determines the presence of a failure from an output of the low-speed developing sensor; and an arithmetic control circuit which identifies a gas section of the metal container in which a failure occurs from an output of the first and second failure determining circuits.

The failure determining apparatus of a gas-insulated electrical appliance determining a failure of a second aspect of the invention, having a cylindrical metal container, a charged conductor housed in the metal container filled with an insulating gas, and a plurality of insulating spacers insulation-supporting the charged conductor from the metal container and partitioning the interior of the metal container into gas sections, comprises a gas pressure detector which detects a change in the gas pressure of the gas sections; a first sampling circuit which fetches a change in the gas pressure from the gas pressure detector on the basis of a failure current detection signal; a failure determining circuit which determines an accident occurring gas section when a change in gas pressure fetched by the first sampling circuit is over a first threshold value; a decomposed gas detector which performs detection by ionizing a decomposed gas of the gas section; a second sampling circuit which fetches a decomposed gas concentration from the decomposed gas detector; a second failure determining circuit which determines an accident occurring gas section when a decomposed gas concentration fetched by the second sampling circuit is over a second threshold value; and an arithmetic control circuit which determines occurrence of a failure in the gas section of the metal container when a decomposed gas exceeding the second threshold value occurs within a gas section in which an increase in pressure of over the first threshold value occurs, on the basis of output of determination of the first and second failure determining circuits.

The failure determining apparatus of a gas-insulated electrical appliance determining a failure of a third aspect of the invention, having a cylindrical metal container, a charged conductor housed in the metal container filled with an insulating gas, and a plurality of insulating spacers insulation-supporting the charged conductor from the metal container and partitioning the interior of the metal container into gas sections, comprises an impact gas pressure detector which detects an impact gas pressure of the gas section; a relay circuit which incorporates an operation signal of the impact gas pressure detector; a decomposed gas detector which performs detection by ionizing a decomposed gas in the gas section; a sampling circuit which fetches a decomposed gas concentration from the decomposed gas detector; a failure determining circuit which determines an accident occurring gas section when a decomposed gas concentration fetched by the sampling circuit is over a prescribed threshold value; and an arithmetic control circuit which determines occurrence of a failure in a gas section of the metal container when there occurs a decomposed gas exceeding the prescribed threshold value within the gas section for which the impact gas pressure detector has operated on the basis of an output of the relay circuit and the failure determining circuit.

The failure determining apparatus of a gas-insulated electrical appliance determining a failure of the fourth aspect of the invention, having a cylindrical metal container, a charged conductor housed in the metal container filled with an insulating gas, and a plurality of insulating spacers insulation-supporting the charged conductor from the metal container and partitioning the interior of the metal container into gas sections, comprises a photo-sensor which detects an arc light leaking upon occurrence of a failure in the gas section; a relay circuit which incorporates an operation signal of the photo-sensor; a decomposed gas detector which performs detection by ionizing a decomposed gas of the gas section; a sampling circuit which fetches a decomposed gas concentration from the decomposed gas detector; a failure determining circuit which determines an accident occurring gas section when a decomposed gas concentration fetched by the sampling circuit is over a prescribed threshold value; and an arithmetic control circuit which determines occurrence of a failure in a gas section of the metal container when there occurs a decomposed gas of over the prescribed threshold value within a gas section in which the photo-sensor has operated, on the basis of an output of the relay circuit and the failure determining circuit.

The failure determining apparatus of a gas-insulated electrical appliance of the second aspect of the invention may further comprises a photo-sensor which detects an arc light leaking upon occurrence of a failure in the gas section; and a relay circuit which incorporates an operation signal of the photo-sensor; wherein the arithmetic control circuit determines occurrence of a failure in a gas section of the metal container when a decomposed gas of over the second threshold value occurs in a gas section in which a pressure increase of over the first threshold value has occurred, and the gas section agrees with the gas section for which the photo-sensor has operated.

In this failure determining apparatus of a gas-insulated electrical appliance, the arithmetic control circuit preferably controls the sampling circuit so as to obtain an output of the decomposed gas detector only for a gas section on the basis of the gas section information sensed by the photo-sensor.

In the failure determining apparatus of a gas-insulated electrical appliance of the second aspect of the invention, the arithmetic control circuit preferably controls the second sampling circuit so as to obtain an output of the decomposed gas detector only for a gas section on the basis of gas section information as determined by the gas pressure detector.

In the failure determining apparatus of a gas-insulated electrical appliance of the third aspect of the invention, the arithmetic control circuit preferably controls the second sampling circuit so as to obtain an output of the decomposed gas detector only for a gas section on the basis of gas section information as determined by the gas pressure detector.

In the failure determining apparatus of a gas-insulated electrical appliance of the fourth aspect of the invention, the arithmetic control circuit preferably controls the sampling circuit so as to obtain an output of the decomposed gas detector only for a gas section on the basis of the gas section information sensed by the photo-sensor.

The failure determining apparatus of a gas-insulated electrical appliance determining a failure of the fifth aspect of the invention, having a metal container, a charged conductor housed in the metal container filled with an insulating gas, and a plurality of insulating spacers insulation-supporting the charged conductor from the metal container and partitioning the interior of the metal container into gas sections, comprises a gas pressure detector which detects the gas pressure of the gas section; a first failure determining circuit which determines an accident occurring gas section when an output of the gas pressure detector is over a first threshold value; a decomposed gas detector which detects a decomposed gas of the gas section; a second failure determining circuit which determines an accident occurring gas section when an output of the decomposed gas detector is over a second threshold value; and an arithmetic control circuit which determines occurrence of a failure in the gas section of the metal container when a decomposed gas exceeding the second threshold value occurs within a gas section in which an increase in pressure of over the first threshold value occurs, on the basis of output of determination of the first and second failure determining circuits; wherein the detectors are arranged in a single gas piping system derived from the gas section.

In the failure determining apparatus of a gas-insulated electrical appliance of the fifth aspect of the invention, the detectors are preferably arranged in a single gas piping system derived from the gas section.

The failure determining apparatus of a gas-insulated electrical appliance of a fifth aspect of the invention may further comprises a detector mounting block made of an insulator having therein a gas piping branching from a gas piping; a gas pressure detector and a decomposed gas detector attached to the branch gas piping of the mounting block, respectively; and a case secured to the block, covering these detectors.

The failure determining apparatus of a gas-insulated electrical appliance of a fifth aspect of the invention may further comprises a block having therein a gas piping branching from a gas piping; a gas pressure detector and a decomposed gas detector attached to the branch gas piping of the block; and a case secured to the block, covering these detectors.

The failure determining apparatus of a gas-insulated electrical appliance of as fifth aspect of the invention may further comprises a temperature detector detecting the temperature of the insulating gas of a gas section mounted in the decomposed gas detector.

BRIEF DESCRIPTION OF THE DRAWINGS

FIG. 17 shows the configuration of the conventional failure determining apparatus of a gas-insulated electrical appliance; and FIG. 18 shows the operations of the conventional failure determining apparatus of a gas-insulated electrical appliance.

DESCRIPTION OF THE PREFERRED EMBODIMENTS

Embodiment 1

Figure 1:
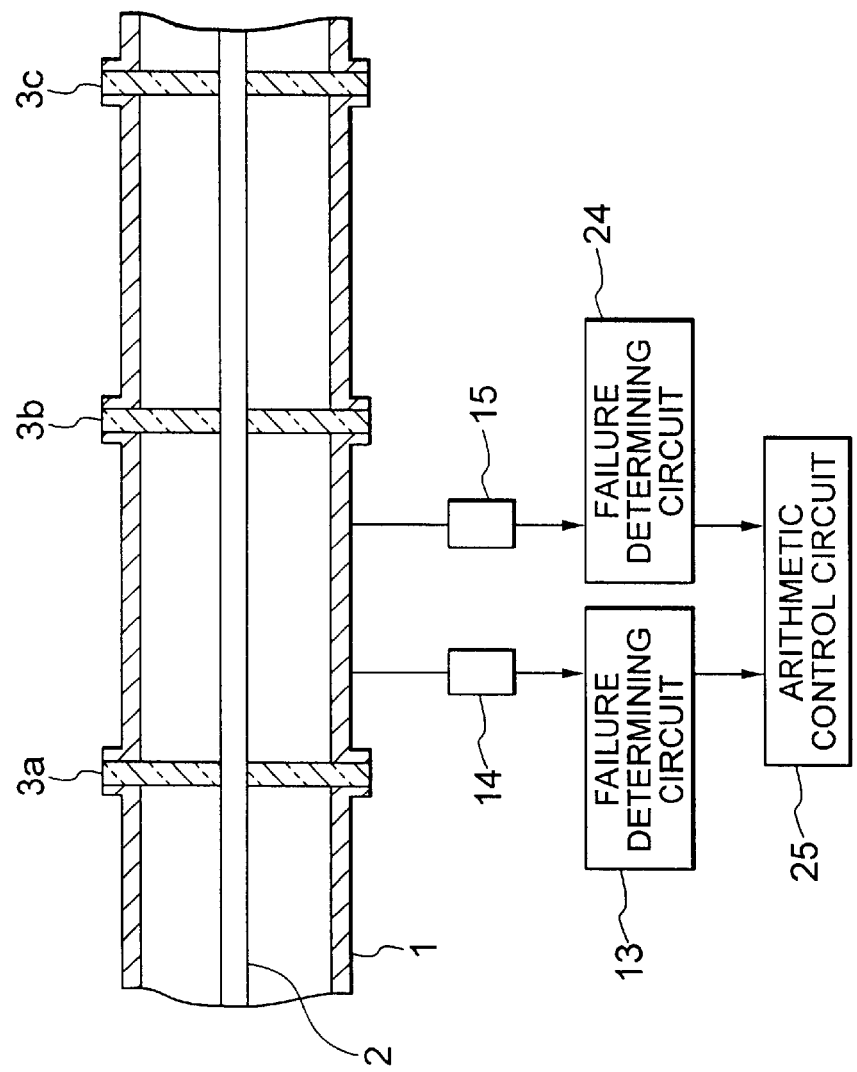
FIG. 1 shows the configuration of the failure determining apparatus of a gas-insulated electrical appliance of an embodiment 1 of the present invention.

The failure determining apparatus of a gas-insulated electrical appliance of an embodiment 1 of the present invention will be described with reference to the drawing. FIG. 1 shows the configuration of the failure determining apparatus of a gas-insulated electrical appliance of the embodiment 1 of the invention. In the drawing, the same reference numerals represent the same or corresponding component parts.

In FIG. 1, 1 represents a metal container of the gas-insulated electrical appliance; 2, a charged conductor; 3a to 3c, insulating spacers supporting the charged conductor 2; 14, a high-speed developing sensor for detecting a high-speed phenomenon caused by a ground-fault such as a gas pressure; 15, a low-speed developing sensor for detecting a low-speed phenomenon caused by a ground-fault such as a decomposed gas; 13, a failure determining circuit; 24, a failure determining circuit; and 25, an arithmetic control circuit for determining the presence/absence of a ground-fault by using the result of determination available from two kinds of sensors.

Figure 2:
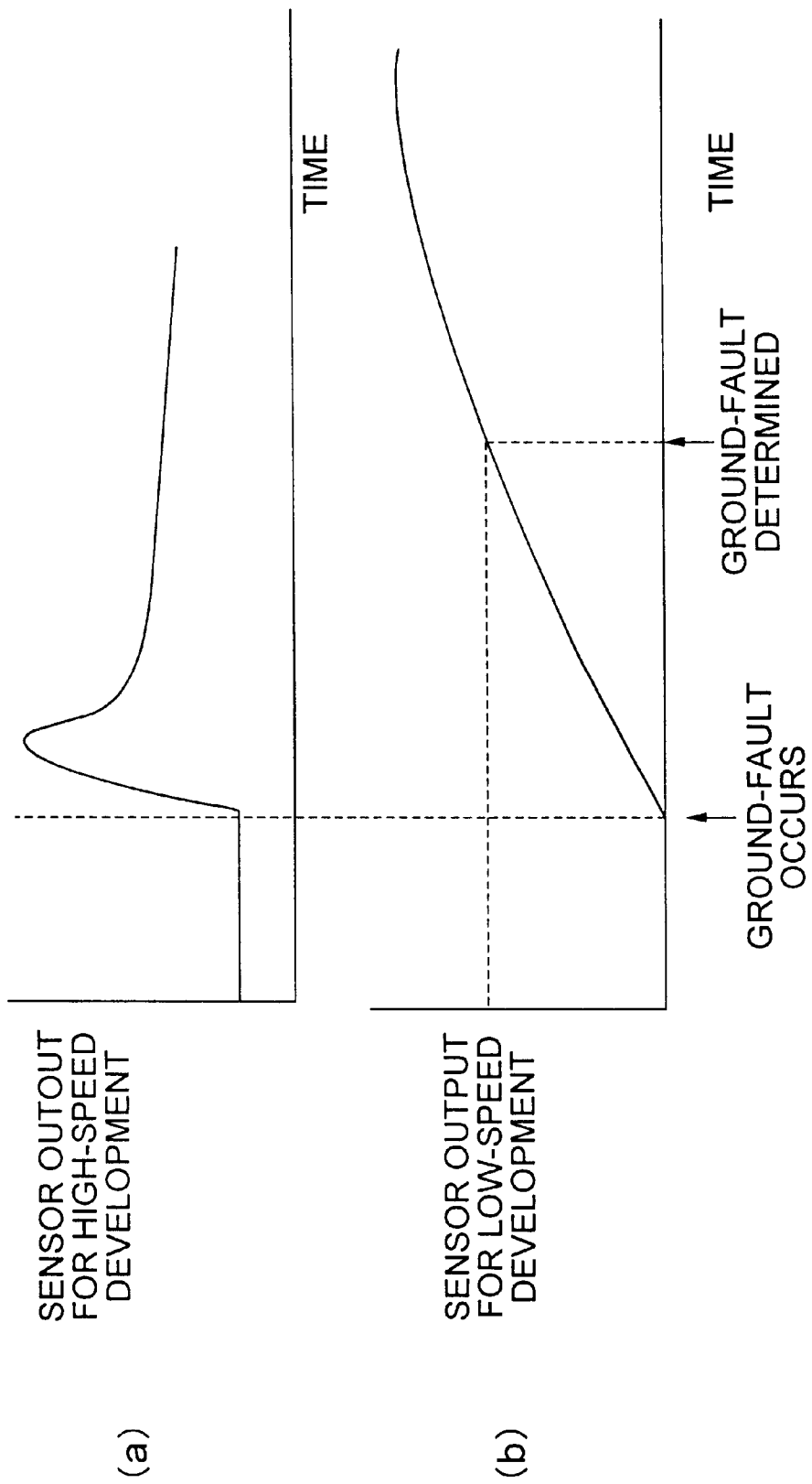
FIG. 2 shows the operations of the failure determining apparatus of a gas-insulated electrical appliance of the embodiment 1 of the invention.

The operations of the failure determining apparatus of a gas-insulated electrical appliance of the embodiment 1 of the invention will now be described with reference to the drawings. FIG. 2 conceptually shows changes with time of an output signal after occurrence of a ground-fault of a high-speed developing sensor and a low-speed developing sensor of the failure determining apparatus of a gas-insulated electrical appliance of the embodiment 1 of the invention.

When a ground-fault the charged conductor 2 occurs with the metal container 1 in any of gas sections formed by partitioning the metal container 1 with insulating spacers 3a and 3b, various phenomena are produced at different response speeds. In this case, the high-speed developing sensor 14 detects a high-speed phenomenon such as a gas pressure, and the failure determining circuit 13 determines a failure.

The low-speed developing sensor 15 detects a low-speed phenomenon such as a decomposed gas, and the failure determining circuit 24 determines a failure. finally, the arithmetic control circuit 25 determines presence/absence of a ground-fault on the basis of the results of determination from the above.

More specifically, as shown in FIG. 2(a), when a gas pressure detected by the high-speed developing sensor 14 is determined to be a failure caused by an increase in the gas pressure after the lapse of several hundred ms by the failure determining circuit 13, and further after the lapse of a certain period of time (for example, several seconds), the decomposed gas detected by the low-speed developing sensor 15 is determined by the failure determining circuit 24 to be a failure when a prescribed concentration is exceeded, the arithmetic control circuit 25 determines that a ground-fault has occurred.

There is therefore available an advantage of improving reliability by accomplishing determination by means of these two kinds of sensors.

A cases where two sensors, one for high-speed development and the other for low-speed development has been described above. It is however possible to obtain the same effect by using three or more sensors.

Embodiment 2

Figure 3:
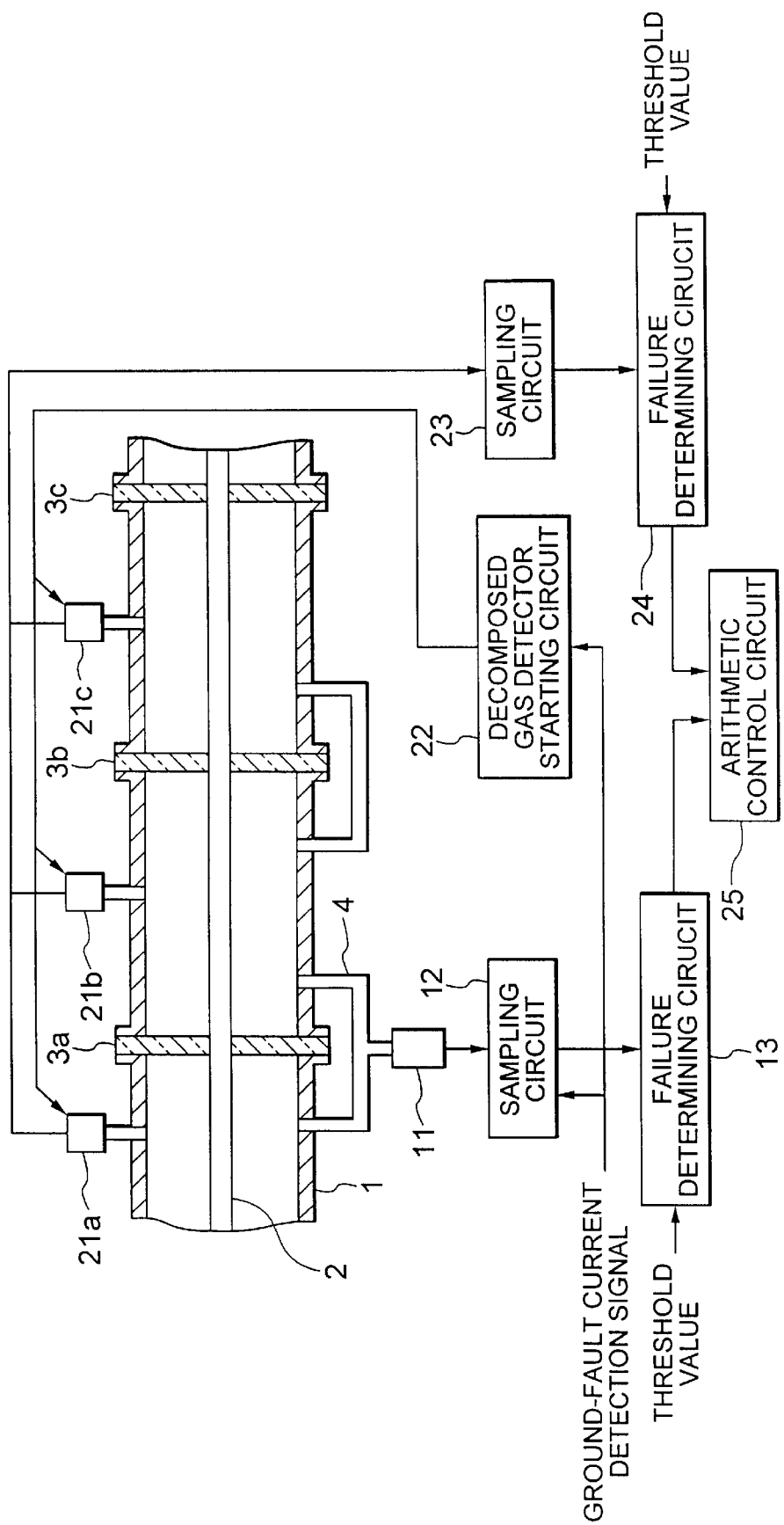
FIG. 3 shows the configuration of the failure determining apparatus of a gas-insulated electrical appliance of an embodiment 2 of the invention.

The failure determining apparatus of a gas-insulated electrical appliance of an embodiment 2 of the invention will now be described with reference to the drawing. FIG. 3 shows the configuration of the failure determining apparatus of a gas-insulated electrical appliance of the embodiment 2 of the invention.

In FIG. 3, 1 represents a metal container of a gas-insulated electrical appliance; 2, a charged conductor; 3a to 3c are insulating spacers supporting the charged conductor 2; 4, a gas piping connecting gas sections for communication; 11, a gas pressure detector; 12, a sampling circuit for sampling an output signal of the gas pressure detector 11; 21a to 21c are decomposed gas detectors provided for the individual gas sections; 22, a decomposed gas detector starting circuit; 23, a sampling circuit for sampling output signals of the decomposed gas detectors 21a to 21c; 24, a failure determining circuit for determining presence/absence of an abnormality from a decomposed gas concentration; and 25, an arithmetic control circuit for determining presence/absence of a ground-fault on the basis of information from the gas pressure detector 11 and the decomposed gas detectors 21a to 21c.

The operations of the failure determining apparatus of a gas-insulated electrical appliance of the embodiment 2 will now be described with reference to the drawings.

When a ground-fault of the charged conductor 2 with the metal container 1 occurs in any of the gas sections formed by partitioning the metal container 1 by the insulating spacers 3a and 3b, a ground-fault current detection signal operates without delay in time. Then, in the interior of a tank, the pressure of the insulating gas suddenly increases near the arc, thus forming a pressure wave, and flows into the static pressure side. The insulating gas is chemically decomposed under the effect of a high temperature produced by arc energy, thus producing a decomposed gas mainly comprising F ions.

The arithmetic control circuit 25 recognizes occurrence of a failure from a ground-fault current detection signal, and issues an acquisition instruction of sampling data for n seconds to the failure determining circuit 13. It starts the decomposed gas detector starting circuit 22, and causes the decomposed gas detectors 21a to 21c to start power supply.

The signal detected by the gas pressure detector 11 causes averaging processing through the sampling circuit 12 and then sent to the failure determining circuit 13 to determine presence/absence of a pressure difference of over the threshold value for each of the gas sections controlled by the gas pressure detector 11. When a gas section exceeding a threshold value, it is output as an accident occurring gas section to the arithmetic control circuit 25.

A signal detected through the decomposed gas detectors 21a to 21c is averaged in the sampling circuit 23, then sent to the failure determining circuit 24, in which the decomposed gas concentration is compared with the threshold value for each gas section. When a gas section exceeding the threshold value, it is output as an accident occurring gas section to the arithmetic control circuit 25.

In the arithmetic control circuit 25, it is determined whether or not the gas section identified by the decomposed gas detectors 21a to 21c is among the gas sections identified by the gas pressure detector 11. If they agree, occurrence of a ground-fault is determined, thus permitting improvement of the accuracy of failure determination of the gas-insulated electrical appliance, and reduction of the confirmation period of the site in trouble.

More specifically, this embodiment 2 covers a failure determining apparatus of a gas-insulated electrical appliance in which a charged conductor 2 is housed in a cylindrical metal container 1, with the both ends of the metal container 1 partitioned by means of insulating spacers 3a to 3c, the charged conductor 2 being insulation-supported by the insulating spacers from the metal container, and gas blocks filled with an insulating gas in the metal container are connected as gas sections; the gas pressure detector 11 for detecting a change in gas pressure is attached to each gas section; the decomposed gas detectors 21a to 21c for detecting the decomposed gas through ionization are attached to the gas sections, respectively, to incorporate a ground-fault current detection signal; the failure determining apparatus comprising the sampling circuit 12 for fetching a change in the gas pressure from the gas pressure detector 11; the failure determining circuit 13 for determining the pressure of the change in comparison with the threshold value; the decomposed gas detector starting circuit 22 for starting power supply to the decomposed gas detector; the sampling circuit 23 for detecting the gas concentration from the decomposed gas detector; the failure determining circuit 24 for determining presence/absence of the decomposed gas; and the arithmetic control circuit 25 determining occurrence of a ground-fault or a short-circuit when a decomposed gas exceeding the threshold value is produced in a gas section among the gas blocks in which an increase in pressure of over the threshold value occurs.

Embodiment 3

Figure 4:
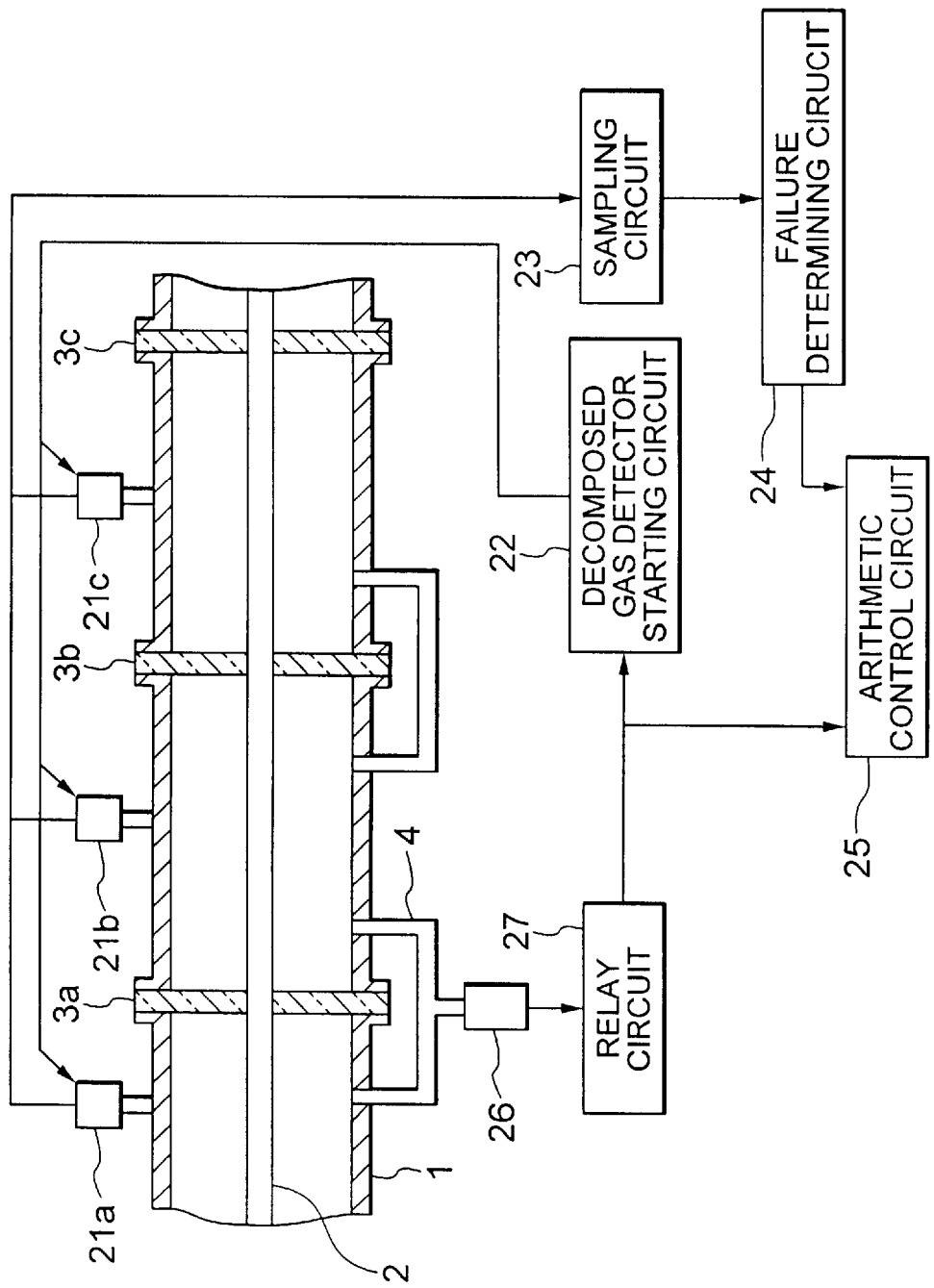
FIG. 4 shows the configuration of the failure determining apparatus of a gas-insulated electrical appliance of an embodiment 3 of the invention.

The failure determining apparatus of a gas-insulated electrical appliance of an embodiment 3 of the invention will now be described with reference to the drawing. FIG. 4 shows the configuration of the failure determining apparatus of a gas-insulated electrical appliance of the embodiment 3 of the invention.

In FIG. 4, 1 represents a metal container of the gas-insulated electrical appliance; 2, a charged conductor; 3a to 3c, insulating spacers supporting the charged conductor 2; a gas piping ensuring communication among the gas sections; 26, an impact gas pressure detector; 27, a relay circuit for incorporating an output signal of the impact gas pressure detector 26; 21a to 21c, decomposed gas detectors installed for each gas section; 22, a decomposed-gas detector starting circuit; 23, a sampling circuit sampling an output signals of the decomposed gas detectors 21a to 21c; 24, a failure determining circuit for determining presence/absence of an-abnormality from the decomposed gas concentration; and 25, an arithmetic control circuit for determining presence/absence of a ground-fault on the basis of information from the impact gas pressure detector 26 and the decomposed gas detectors 21a to 21c.

The operations of the failure determining apparatus of a gas-insulated electrical appliance of the embodiment 3 will now be described with reference to the drawings.

When a ground-fault of the charged conductor 2 occurs with the metal container 1 in any of the gas sections formed by partitioning the metal container 1 by the insulating spacers 3a and 3b, there occurs a sudden increase in pressure under the effect of arc energy near the arc in the tank, and furthermore, the insulating gas is chemically decomposed by a high temperature caused by arc energy, thus producing a decomposed gas mainly comprising F ions.

The arithmetic control circuit 25 recognizes occurrence of a failure from the operating signal of the impact gas pressure detector 26 detecting a sudden increase in the pressure. This is followed by starting of the decomposed gas detector starting circuit 22 to supply power to the decomposed gas detectors 21a to 21c.

Operating information of the impact gas pressure detector 26 causes operation of the relay corresponding to the gas section of the relay circuit 27, and the gas section is output as an accident occurring gas section to the arithmetic control circuit 25.

Signals detected by the decomposed gas detectors 21a to 21c are averaged by the sampling circuit 23. The result is sent to the failure determining circuit 24, in which the decomposed gas concentration is compared with the threshold value for each gas section. When a gas section exceeding the threshold value, it is output as an accident occurring gas section to the arithmetic control circuit 25.

The arithmetic control circuit 25 determines whether or not the gas sections identified by the decomposed gas detectors 21a to 21c are among the gas sections identified by the gas pressure detector 26. If they agree, occurrence of a ground-fault is determined, thus making it possible to provide an apparatus conducting failure determination at a higher accuracy.

More specifically, this embodiment 3 covers a failure determining apparatus of a gas-insulated electrical appliance in which a charged conductor 2 is house in a cylindrical metal container 1, with the both ends of the metal container 1 partitioned by means of insulating spacers 3a to 3c, the charged conductor 2 being insulation-supported by the insulating spacers from the metal container, and gas blocks filled with an insulating gas in the metal container are connected as gas sections; the impact gas pressure detector 26 operating on an amount of change if impact gas pressure is attached to each gas section; the decomposed gas detectors 21a to 21c for detecting the decomposed gas through ionization are attached to the gas sections; the failure determining apparatus comprising a relay circuit 27 for incorporating an operating signal of the impact gas pressure detector; a decomposed gas detector starting circuit 22 for starting the power supply for the decomposed gas detector; a sampling circuit 23 for detecting the gas concentration from the decomposed gas detectors; a failure determining circuit 24 for determining presence/absence of a decomposed gas; and the arithmetic control circuit 25 for determining occurrence of a ground-fault or a short-circuit when a decomposed gas exceeding the threshold value is produced in any gas sections for which the impact gas pressure detector operates.

Embodiment 4

Figure 5:
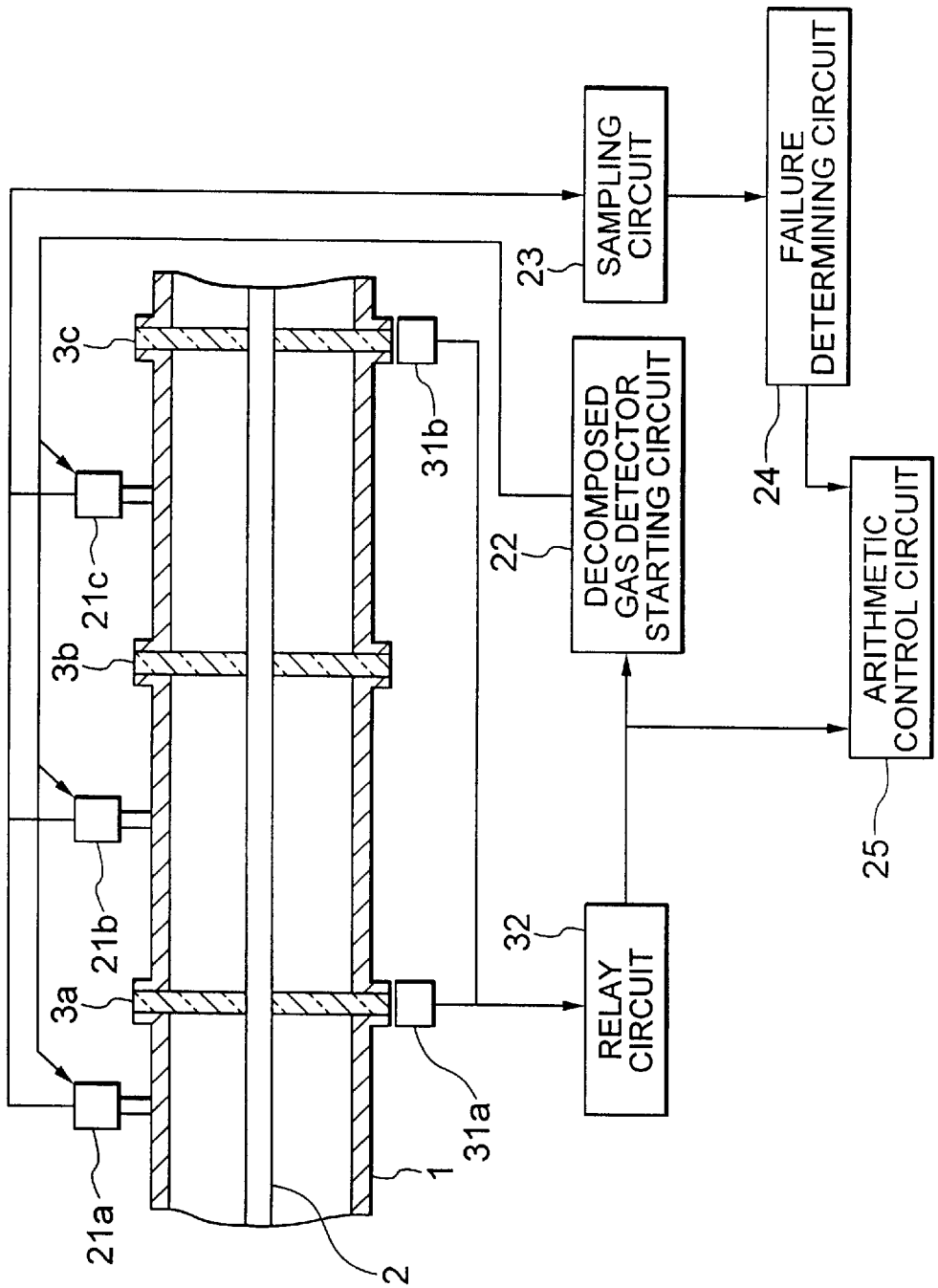
FIG. 5 shows the configuration of the failure determining apparatus of a gas-insulated electrical appliance of an embodiment 4 of the invention.

The failure determining apparatus of a gas-insulated electrical appliance of an embodiment 4 of the invention will now be described with reference to the drawing. FIG. 5 shows the configuration of the failure determining apparatus of a gas-insulated electrical appliance of the embodiment 4 of the invention.

In FIG. 5, 1 represents a metal container of a gas-insulated electrical appliance; 2, a charged conductor; 3a to 3c are insulating spacers supporting the charged conductor 2; 4, a gas piping connecting the gas sections for communication; 31a to 31b are photo-sensors; 32, a relay circuit for incorporating operating signals of the photo-sensors 31a to 31b; 21a to 21c, decomposed gas detectors installed for the individual gas sections, respectively; 22, a decomposed gas detector starting circuit; 23, a sampling circuit for sampling output signals of the decomposed gas detectors 21a to 21c; 24, a failure determining circuit for determining presence/absence of an abnormality from the decomposed gas concentration; and 25, an arithmetic control circuit for making determination on the basis of information from the photo-sensors 31a and 31b and the decomposed gas detectors 21a to 21c.

The operations of the failure determining apparatus of a gas-insulated electrical appliance of this embodiment 4 will be described with reference to the drawings.

When there occurs a ground-fault of the charged conductor 2 with the metal container 1 in any of the gas sections formed by partitioning the metal container 1 with the insulating spacers 3a and 3b, an arc light is produced in the tank, and leaks to outside through the insulating spacers 3a and 3b. Furthermore, the insulating gas is chemically decomposed by the high temperature resulting from arc energy, thus generating a decomposed gas mainly comprising F ions.

The arithmetic control circuit 25 incorporates operating signals of the photo-sensors 31a and 31b detecting the arc light and recognizes occurrence of a failure. This is followed by starting of the decomposed gas detector starting circuit 22 to supply power to the decomposed gas detectors 21a to 21c.

Operating information of the photo-sensors 31a and 31b causes operation of the relay in response to the gas sections in the relay circuit 32, and output the result as accident occurring gas sections to the arithmetic control circuit 25.

Signals detected by the decomposed gas detectors 21a to 21c are averaged by the sampling circuit 23, and sent to the failure determining circuit 24, in which the decomposed gas concentration is compared with the threshold value for each gas section. When a gas section exceeding the threshold value is detected, it is output as an accident occurring gas section to the arithmetic control circuit 25.

The arithmetic control circuit 25 determines whether or not the gas sections identified by the decomposed gas detectors 21a to 21c are among the gas sections identified by the photo-sensors 31a and 31b. When they agree, occurrence of a ground-fault is determined, thus bringing about an effect of improving the accuracy of failure determination.

More specifically, this embodiment 4 covers a failure determining apparatus of a gas-insulated electrical appliance in which a charged conductor 2 is housed in a cylindrical metal container 1, with the both ends of the metal container 1 partitioned by means of insulating spacers 3a to 3c, the charged conductor 2 being insulation-supported by the insulating spacers from the metal container, and pas partitions filled with an insulating gas in the metal container are connected as gas sections; the photo-sensors 31a and 31b for detecting the arc light leaking from the insulating spacers upon occurrence of a ground-fault or a short-circuit are attached to the insulating spacers partitioning the both ends of the metal container; the decomposed gas detectors 21a to 21c for detecting the gas through ionization are attached to the individual gas sections, respectively; the failure determining apparatus comprising a relay circuit 32 for incorporating operating signals of the photo-sensors; the decomposed gas detector starting circuit 22 for starting power supply to the decomposed gas detector; the sampling circuit 23 for detecting the gas concentration from the decomposed gas detector; the failure determining circuit 24 for determining presence/absence of the decomposed gas; and the arithmetic control circuit 25 determines occurrence of a ground-fault or a short-circuit when a decomposed gas exceeding the threshold value is produced in any of the gas sections.

Embodiment 5

Figure 6:
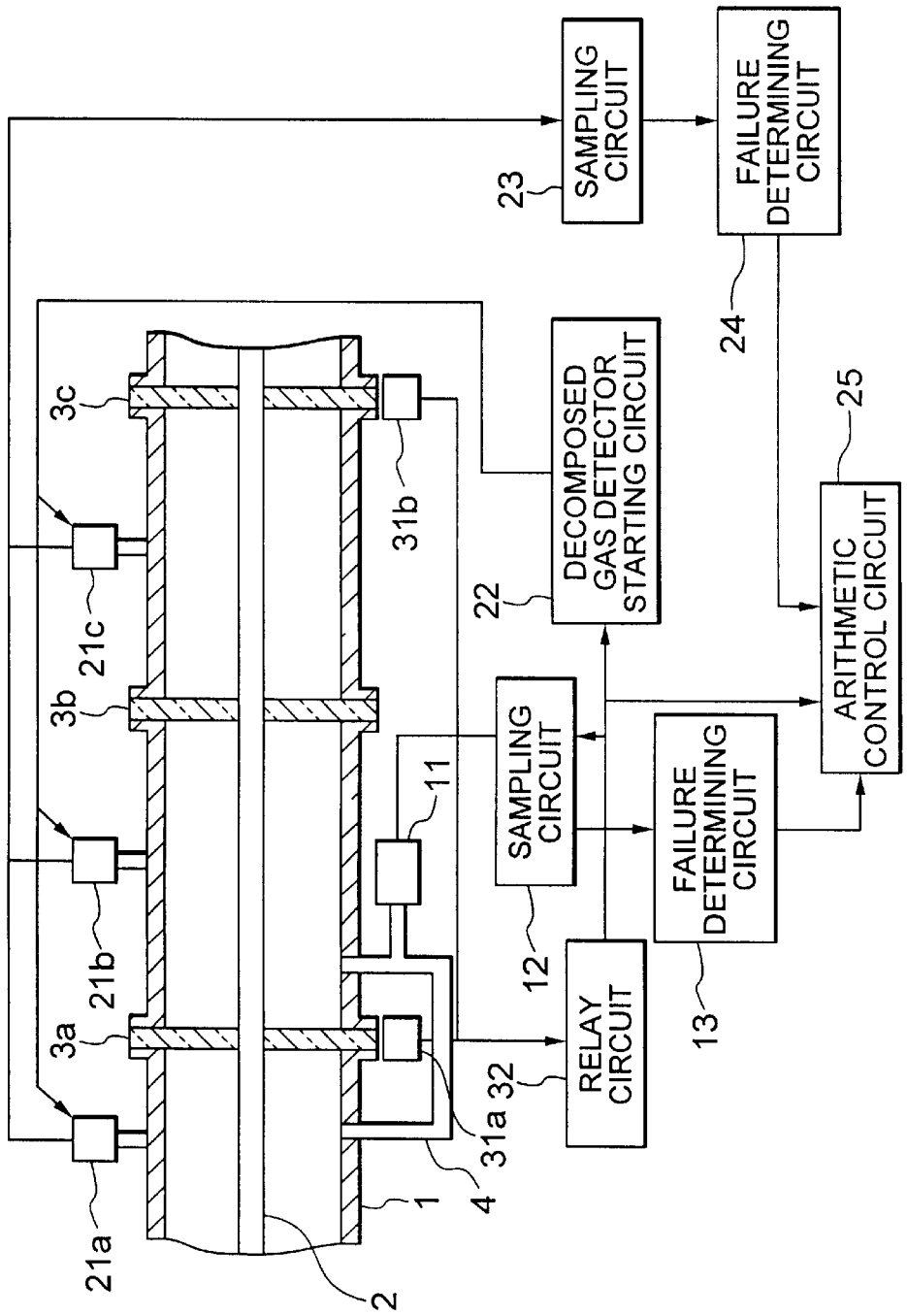
FIG. 6 shows the configuration of the failure determining apparatus of a gas-insulated electrical appliance of an embodiment 5 of the invention.

The failure determining apparatus of a gas-insulated electrical appliance of an embodiment 5 of the invention will now be described with reference to the drawing. FIG. 6 shows the configuration of the failure determining apparatus of a gas-insulated electrical appliance of the embodiment 5 of the invention.

In FIG. 6, 1 represents a metal container of a gas-insulated electrical appliance; 2, charged conductor; 3a to 3c, insulating spacers supporting the charged conductor 2; 4, a gas piping connecting the gas sections for communication; 11, a gas pressure detector; 12, a sampling circuit for sampling an output signal of the gas pressure detector 11; 13, a failure determining circuit; 31a and 31b, photo-sensors; 32, a relay circuit for incorporating operating signals of the photo-sensors 31a and 31b; 21a to 21c, decomposed gas detectors installed for the individual gas sections; 22, decomposed gas detector starting circuit; 23, a sampling circuit for sampling output signals of the decomposed gas detectors 21a to 21c; 24, a failure determining circuit for determining presence/absence of an abnormality from the decomposed gas concentration; and 25, an arithmetic control circuit for making determination on the basis of information of the gas pressure detector 11, the photo-sensors 31a and 31b, and the decomposed gas detectors 21a to 21c.

The operations of the failure determining apparatus of a gas-insulted electrical appliance of this embodiment 5 will now be describe with reference to the drawings.

When a ground-fault of the charged conductor 2 occurs with the metal container 1 in any of the gas sections formed by partitioning the metal container 1 with insulating spacers 3a and 3b, are light is produced in the tank and leaks to outside through the insulating spacers 3a to 3c. Furthermore, pressure of the insulating gas suddenly increases near the arc flows onto the static pressure side in the form of a pressure wave. The insulating gas is chemically decomposed by a high temperature resulting from arc energy, thus producing a decomposed gas mainly comprising F ions.

The arithmetic control circuit 25 recognizes occurrence of a failure from the operating signal information of the photo-sensors 31a and 31b detecting the arc light. That is, the operating information of the photo-sensors 31a and 31b operates the relay corresponding to the gas section in the relay circuit 32, and outputs the same as an accident occurring gas section to the arithmetic control circuit 25. Then, the arithmetic control circuit 25 instructs the failure determining circuit 13 of the gas pressure detector 11 to compare the pressure before occurrence of the failure and the pressure after the lapse of n seconds from the occurrence of the failure, and starts the decomposed gas detector starting circuit 22 to supply power to the decomposed gas detectors 21a to 21c.

The signals detected by the gas pressure detector 11 are averaged by the sampling circuit 12 and then sent to the failure determining circuit 13 to determine presence/absence of a pressure difference exceeding the threshold value for each gas section. When a gas section of over the threshold value is detected, the gas section is output as an accident occurring gas section to the arithmetic control circuit 25.

The signals detected by the decomposed gas detectors 21a to 21c are averaged by the sampling circuit 23, then sent to the failure determining circuit 24, in which the decomposed gas concentration is compared with the threshold value for each gas section. When a gas section exceeding the threshold value is detected, it is output as an accident occurring gas section to the arithmetic control circuit 25.

When the gas section identified by the photo-sensors 31a and 31b is the same as the gas section identified by the gas pressure detector 11, and a decomposed gas of a concentration of over the threshold value is determined to be produced in a gas partition within a gas section identified by the two kinds of sensors by the decomposed gas detectors 21a to 21c as well, occurrence of a ground-fault is determined, thus bringing about an effect of improving the accuracy of failure determination of an electrical appliance.

More specifically, this embodiment 5 covers a failure determining apparatus of a gas-insulated electrical appliance in which a charged conductor 2 is housed in a cylindrical metal container 1, with the both ends of the metal container 1 partitioned by means of insulating spacers 3a to 3c, the charged conductor 2 being insulation-supported by the insulating spacers from the metal container, and gas partitions filled with an insulating gas in the metal container are connected as gas sections; photo-sensors 31a and 31b for detecting the arc light leaking from the insulating spacers upon occurrence of a ground-fault or a short-circuit are attached to the individual insulating spacers partitioning the both ends of the metal container; the gas pressure detector 11 for detecting a change in gas pressure is attached to each gas section; the decomposed gas detectors 21a to 21c for detecting ionized gas are attached to each gas section; the failure determining apparatus the relay circuit 32 for incorporating the operating signals of the photo-sensors; the sampling circuit 12 for fetching a change in the gas pressure from the gas pressure detector 11; the failure determining circuit 13 for determining the change in pressure in comparison with the threshold value; the decomposed gas detector starting circuit 22 for starting power supply to the decomposed gas detector; the sampling circuit 23 for detecting the gas concentration from the decomposed gas detector; the failure determining circuit 24 for determining presence/absence occurrence of the decomposed gas in comparison with the threshold value; and the arithmetic control circuit 25 determines occurrence of a ground-fault or a short-circuit when the gas section for which the photo-sensors operate agrees with the gas section in which a pressure increase of over the threshold value occurs, and when a decomposed gas exceeding the threshold value is produced in the gas partition in the same gas section.

Embodiment 6

Figure 7:
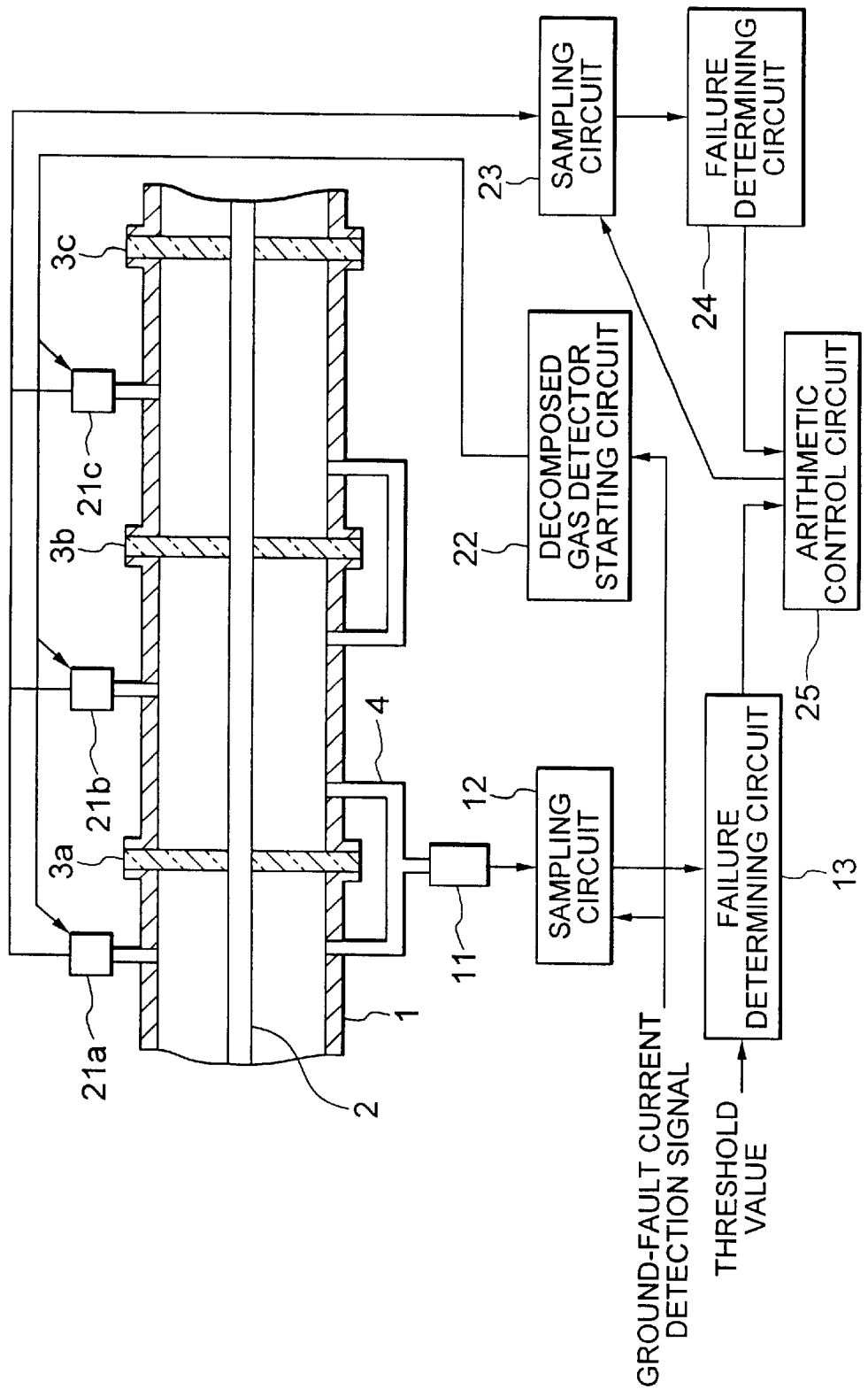
FIG. 7 shows the configuration of the failure determining apparatus of a gas-insulated electrical appliance of an embodiment 6 of the invention.

The failure determining apparatus of a gas-insulated electrical appliance of an embodiment 6 of the invention will now be described with reference to the drawing. FIG. 7 shows the configuration of the failure of the failure determining apparatus of a gas-insulated electrical appliance of the embodiment 6 of the invention.

In FIG. 7, 1 represents a metal container; 2, a charged conductor; 3a to 3c, insulating spacers supporting the charged conductor 2; 4, a gas piping connecting gas sections for communication; 11, a gas pressure detector; 12, a sampling circuit sampling an output signal of the gas pressure detector 11; 13, a failure determining circuit; 21a to 21c, decomposed gas detectors installed for each gas section; 22, a decomposed gas detector starting circuit; 23, a sampling circuit sampling output signals of the decomposed gas detectors 21a to 21c; 24, a failure determining circuit determining presence/absence from the decomposed gas concentration; and 25, an arithmetic control circuit determining presence/absence of a ground-fault on the basis of information of the gas pressure detector 11 and the decomposed gas detectors 21a to 21c.

The operations of the failure determining apparatus of a gas-insulated electrical appliance of the embodiment 6 will now be described with reference to the drawings.

When there occurs a ground-fault of the charged conductor 2 with the metal container 1 in any of the gas section formed by partitioning the metal container 1 with insulating spacers 3a and 3b, the failure current detection signal operates with no delay in time. In the tank, the insulating gas pressure suddenly increases near the arc, thus producing a pressure wave. A gas dynamic pressure signal corresponding to the dynamic pressure of the insulating gas caused by the pressure wave is produced in addition to the gas static pressure signal corresponding to the static pressure of the insulating gas filling the gas section. At the same time, the insulating gas is chemically decomposed by the high temperature produced by arc energy of the ground-fault, leading to production of a decomposed gas mainly comprising F ions.

With the failure current detection signal as the starting point, the decomposed gas detector starting circuit 22 which is a power supply circuit for starting the sampling circuit 12 of the gas pressure detector 11, and the decomposed gas detector 21a to 21c is started.

The detection signals of the gas pressure detector 11 are averaged by the sampling circuit 12, and then sent to the failure determining circuit 13, where presence/absence of a pressure difference of over the threshold value is determined for each gas section. When a gas section exceeding the threshold value is detected, it is output as an accident occurring gas section to the arithmetic control circuit 25.

The arithmetic control circuit 25 instructs the sampling circuit 23 to conduct sampling of decomposed gas data only for the gas section identified by the gas pressure-detector 11.

The sampling circuit 23 collects only an output of the decomposed gas detector 21 of the specified gas section, compares the decomposed gas concentration with the threshold value in the failure determining circuit 24, and reports the result to the arithmetic control circuit 25.

When it is determined that the decomposed gas concentration is abnormal in the gas section identified by the gas pressure detector 11 and in the specified information incorporated by the decomposed gas detector 21, occurrence of a ground-fault is determined. Different phenomena caused by a ground-fault accident are thus individually confirmed by the detectors, providing advantages of improving accuracy of failure determination of an electrical appliance, and reduction of the time required for determination of occurrence of a failure.

More specifically, this embodiment 6 covers a failure determining apparatus of a gas-insulated electrical appliance in which a charged conductor 2 is housed in a cylindrical metal container 1, with the both ends of the metal container 1 partitioned by means of insulating spacers 3a to 3c, the charged conductor 2 being insulation-supported by the insulating spacers from the metal container, and gas blocks filled with an insulating gas in the metal container are connected as gas sections; the gas pressure detector 11 for detecting a change in gas pressure is attached to each gas section; the decomposed gas detectors 21a to 21c for detecting the decomposed gas through ionization are attached to the gas sections, respectively, to incorporate a ground-fault current detection signal; the failure determining apparatus comprising the sampling circuit 12 for fetching a change in the gas pressure from the gas pressure detector 11; the failure determining circuit 13 for determining the pressure of the change in comparison with the threshold value; the decomposed gas detector starting circuit 22 for starting power supply to the decomposed gas detector; the sampling circuit 23 for detecting the gas concentration from the decomposed gas detector; the failure determining circuit 24 for determining presence/absence of the decomposed gas; and the arithmetic control circuit 25 determining occurrence of a ground-fault or a short-circuit when a decomposed gas exceeding the threshold value is produced in a gas section among the gas blocks in which an increase in pressure of over the threshold value occurs; wherein the failure determining apparatus has a function of controlling the sampling circuit so as to obtain output of the decomposed gas detector only for the gas blocks within a gas section on the basis of the gas section information identified by the gas pressure detector 11.

Embodiment 7

Figure 8:
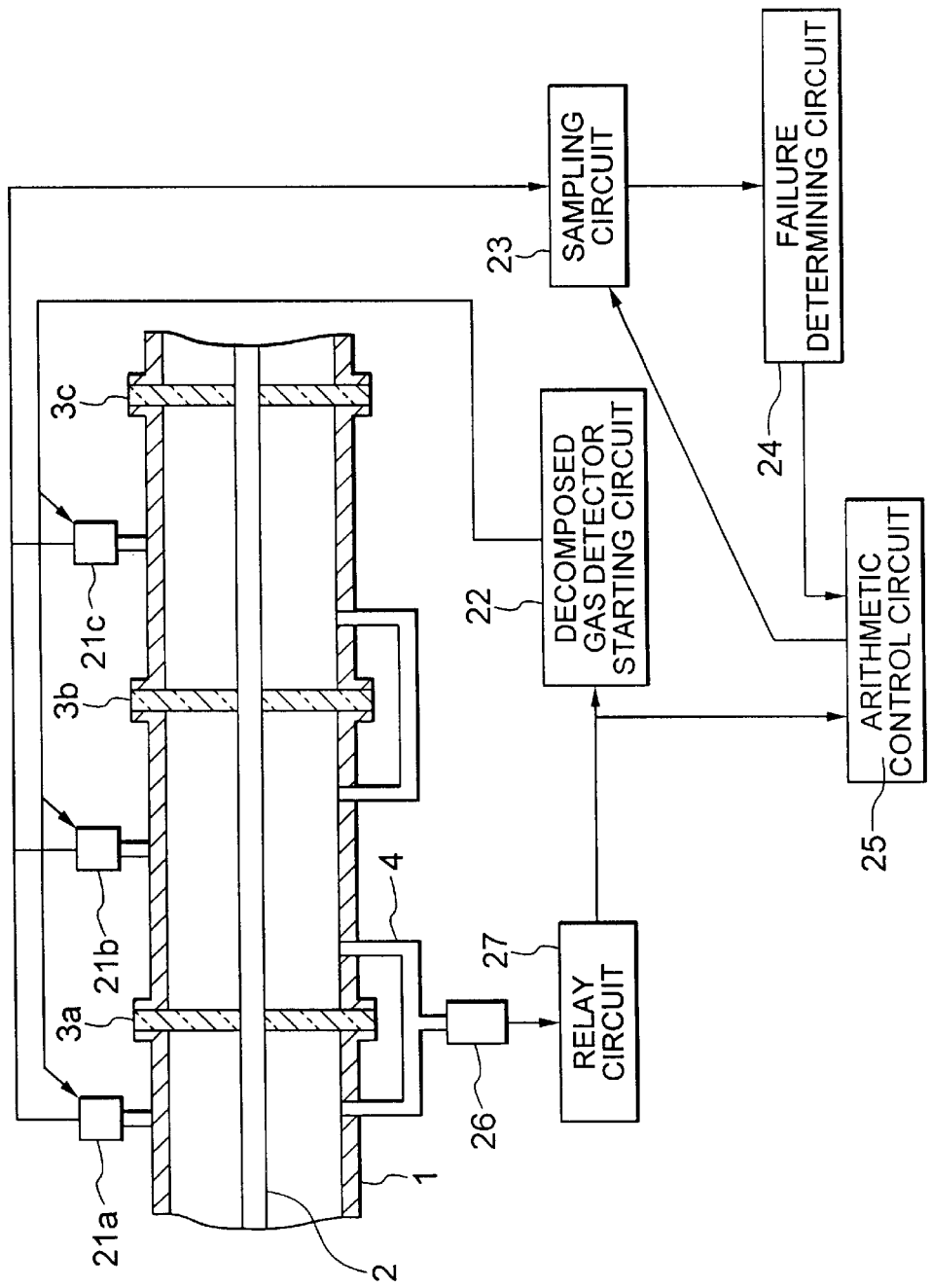
FIG. 8 shows the configuration of the failure determining apparatus of a gas-insulated electrical appliance of an embodiment 7 of the invention.

The failure determining apparatus of a gas-insulated electrical appliance of an embodiment 7 of the invention will now be described with reference to the drawing. FIG. 8 shows the configuration of the failure determining apparatus of a gas-insulated electrical appliance of the embodiment 7 of the invention.

In FIG. 8, 1 represents a metal container of a gas-insulated electrical appliance; 2, a charged conductor; 3a to 3c, insulating spacers supporting the charged conductor 2; 4, a gas piping connecting gas sections for communication; 26, an impact gas pressure detector; 27, a relay circuit for incorporating an output signal of the impact gas pressure detector 26; 21a to 21c, decomposed gas detectors installed for the individual gas sections; 22, a decomposed gas detector starting circuit; 23, a sampling circuit for sampling output signals of the decomposed gas detectors 21a to 21c; 24, a failure determining circuit for determining presence/absence of an abnormality from the decomposed gas concentration; and 25, an arithmetic control circuit for determining presence/absence of a ground-fault on the basis of information of the impact gas pressure detector 26 and the decomposed gas detectors 21a to 21c.

The operations of the failure determining apparatus of a gas-insulated electrical appliance of the embodiment 7 of the invention will now be described with reference to the drawing.

When a ground-fault of the charged conductor 2 occurs with the metal container 1 in any of the gas sections formed by partitioning the metal container 1 with insulating spacers 3a and 3b, the insulating gas pressure suddenly increases near the arc, producing a pressure wave. This pressure wave is detected by the impact gas pressure detector 26, and the relay circuit 27 is driven by the operating signal. At the same time, the decomposed gas detector starting circuit 22 is started to supply power to the decomposed gas detectors 21a to 21c for all the gas blocks.

The arithmetic control circuit 25 searches for an accident occurring gas section on the basis of the operating information of the impact gas pressure detector 26 incorporated by the relay circuit 27.

The arithmetic control circuit 25 instructs the sampling circuit 23 to sample decomposed gas data only for the gas section identified by the impact gas pressure detector 26. The sampling circuit 23 collects output of only the decomposed gas detectors 21 of the specified gas section. The decomposed gas concentration is compared with the threshold value by the failure determining circuit 24, and the result of comparison is reported to the arithmetic control circuit 25.

When a decomposed gas is detected by any one of the specified decomposed gas detectors 21, the arithmetic control circuit 25 determines occurrence of a ground-fault. Different phenomena caused by an internal failure of GIS are thus confirmed by the individual detectors, bringing about advantages of improving the accuracy of failure determination of the electrical appliance and reducing the time required for determining presence/absence of a failure.

More specifically, this embodiment 7 covers a failure determining apparatus of a gas-insulated electrical appliance in which a charged conductor 2 is housed in a cylindrical metal container 1, with the both ends of the metal container 1 partitioned by means of insulating spacers 3a to 3c, the charged conductor 2 being insulation-supported by the insulating spacers from the metal container, and gas blocks filled with an insulating gas in the metal container are connected as gas sections; an impact pressure detector 26 operating by the amount of change in the impact gas pressure is attached to each gas section; and decomposed gas detectors 21a to 21c for detecting ionized gas are attached to the individual gas blocks; the failure determining apparatus comprising a relay circuit 27 for incorporating the operating signal of the impact gas pressure detector; the decomposed gas detector starting circuit 22 for starting power supply to the decomposed gas detector; the sampling circuit 23 for detecting the gas concentration from the decomposed gas detector; the failure determining circuit 24 for determining presence/absence of the decomposed gas; and the arithmetic control circuit 25 determining occurrence of a ground-fault or a short-circuit when a decomposed gas of over the threshold value is produced in a gas block in the gas section for which the impact gas pressure detector has operated; wherein the failure determining apparatus has a function of controlling the sampling circuit so as to obtain an output of the decomposed gas detector for only the gas block in the gas section on the basis of the gas section information identified by the impact gas pressure detector 26.

Embodiment 8

Figure 9:
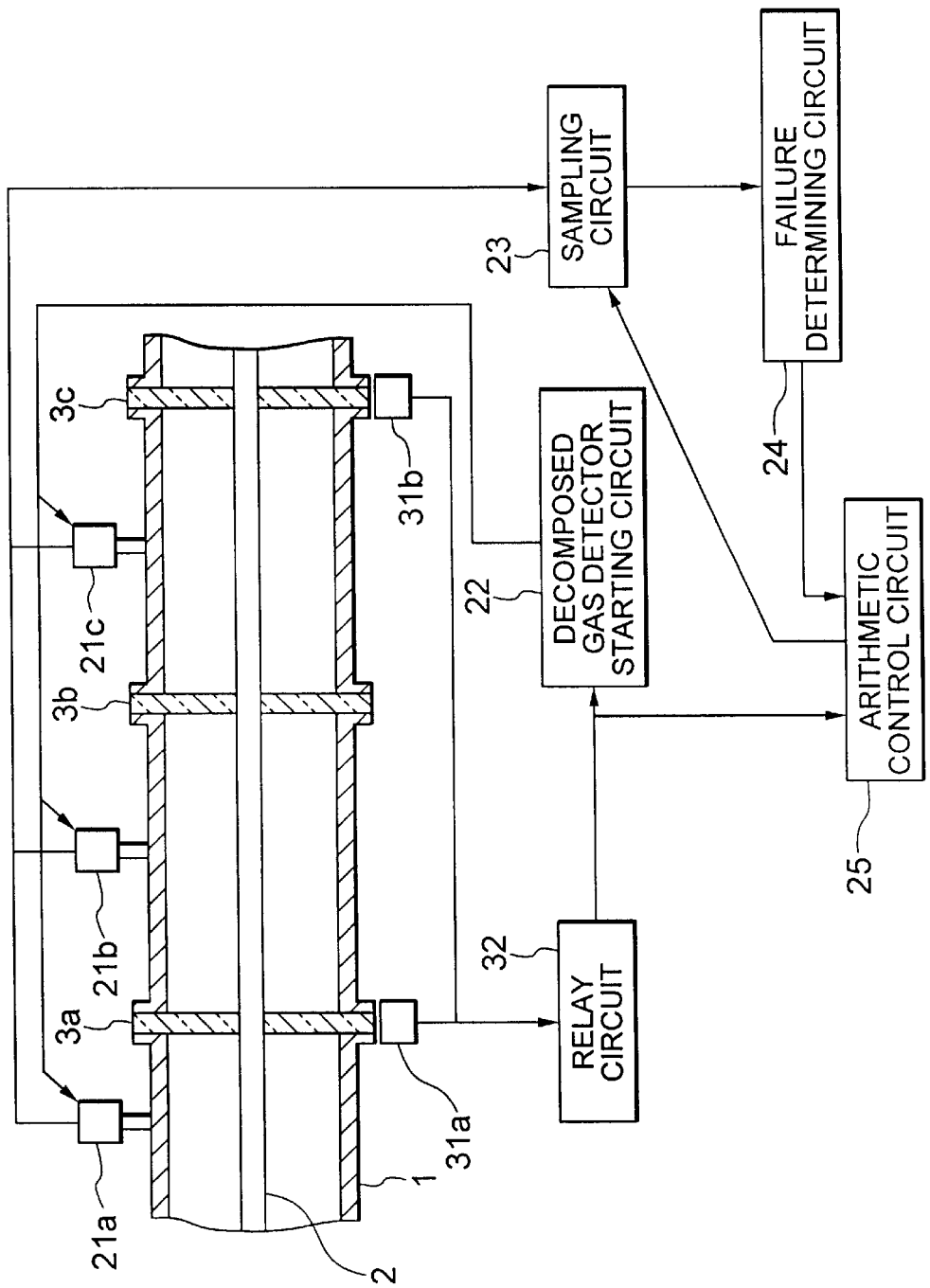
FIG. 9 shows the configuration of the failure determining apparatus of a gas-insulated electrical appliance of an embodiment 8 of the invention.

The failure determining apparatus of a gas-insulated electrical appliance of an embodiment 8 of the invention will now be described with reference to the drawing. FIG. 9 shows the configuration of the failure determining apparatus of a gas-insulated electrical appliance of the embodiment 8 of the invention.

In FIG. 9, 1 represents a metal container of a gas-insulated electrical appliance; 2, a charged conductor; 3a to 3c, insulating spacers supporting the charged conductor 2; 4, a gas piping connecting gas sections for communication; 31a and 31b, photo-sensors; 32, a relay circuit for incorporating operating signals of the photo-sensors 31a and 31b; 22, a decomposed gas detector starting circuit; 23, a sampling circuit for sampling output signals of the decomposed gas detectors 21a to 21c; 24, a failure determining circuit for determining presence/absence of an abnormality from the decomposed gas concentration; and 25, an arithmetic control circuit for making determination on the basis of information of the photo-sensors 31a and 31b and the decomposed gas detectors 21a to 21c.

The operations of the failure determining apparatus of a gas-insulated electrical appliance of the embodiment 8 will now be described with reference to the drawing.

When a ground-fault of the charged conductor occurs with the metal container 1 in any of the gas sections formed by partitioning the metal container 1 with the insulating spacers 3a and 3b, the insulating gas pressure suddenly increases near the arc, producing a pressure wave, and at the same time, light emission of arc energy occurs and leaks through the insulating spacers 3a to 3c. This leakage light is incorporated by the photo-sensors 31a and 31b, and the relay circuit 32 is driven by means of an operating signal. Simultaneously, the decomposed gas detector starting circuit 22 is started to supply power to the decomposed gas detectors 21a to 21c of all the gas blocks.

The arithmetic control circuit 25 derives an accident occurring gas section from the operating information of the relay driven by the relay circuit 32, and instructs the sampling circuit 23 so as to sample decomposed gas data only for the derived gas section.

The sampling circuit 23 collects output of the decomposed gas detector 21 of the specified gas section. The decomposed gas concentration is compared with the threshold value in the failure determining circuit 24, and the result is reported to the arithmetic control circuit 25.

When the decomposed gas is produced in any of the specified decomposed gas detectors 21, the arithmetic control circuit 25 determines occurrence of a ground-fault. Different phenomena caused by the ground-fault accident as described above are confirmed by the individual detectors, bringing about advantages of improving the accuracy of failure determination of the electrical appliance and reducing the time required for determining presence/absence of a failure.

More specifically, this embodiment 8 covers a failure determining apparatus of a gas-insulated electrical appliance in which a charged conductor 2 is housed in a cylindrical metal container 1, with the both ends of the metal container 1 partitioned by means of insulating spacers 3a to 3c, the charged conductor 2 being insulation-supported by the insulating spacers from the metal container, and gas blocks filled with an insulating gas in the metal container are connected as gas sections; photo-sensors 31a and 31b detecting arc light leaking from the insulating spacers upon occurrence of a ground-fault or a short-circuit are attached to the individual spacers partitioning the both ends of the metal container; decomposed gas detectors 21a to 21c detecting ionized gas are attached to each gas block; the failure determining apparatus comprising a relay circuit 32 incorporating operating signals of the photo-sensors; a decomposed gas detector starting circuit 22 for starting power supply to the decomposed gas detectors; a sampling circuit 23 for detecting a gas concentration from the decomposed gas detectors; a failure determining circuit 24 for determining presence/absence of a decomposed gas; and an arithmetic control circuit 25 determining occurrence of a ground-fault or a short-circuit when the decomposed gas of over the threshold value is produced in the gas section for which the photo-sensors has operated; wherein the failure determining apparatus has a function of controlling the sampling circuit 23 so as to obtain outputs of the decomposed gas detector for only the gas block within the gas section on the basis of the gas section information for the gas section for which the photo-sensors have operated.

Embodiment 9

Figure 10:
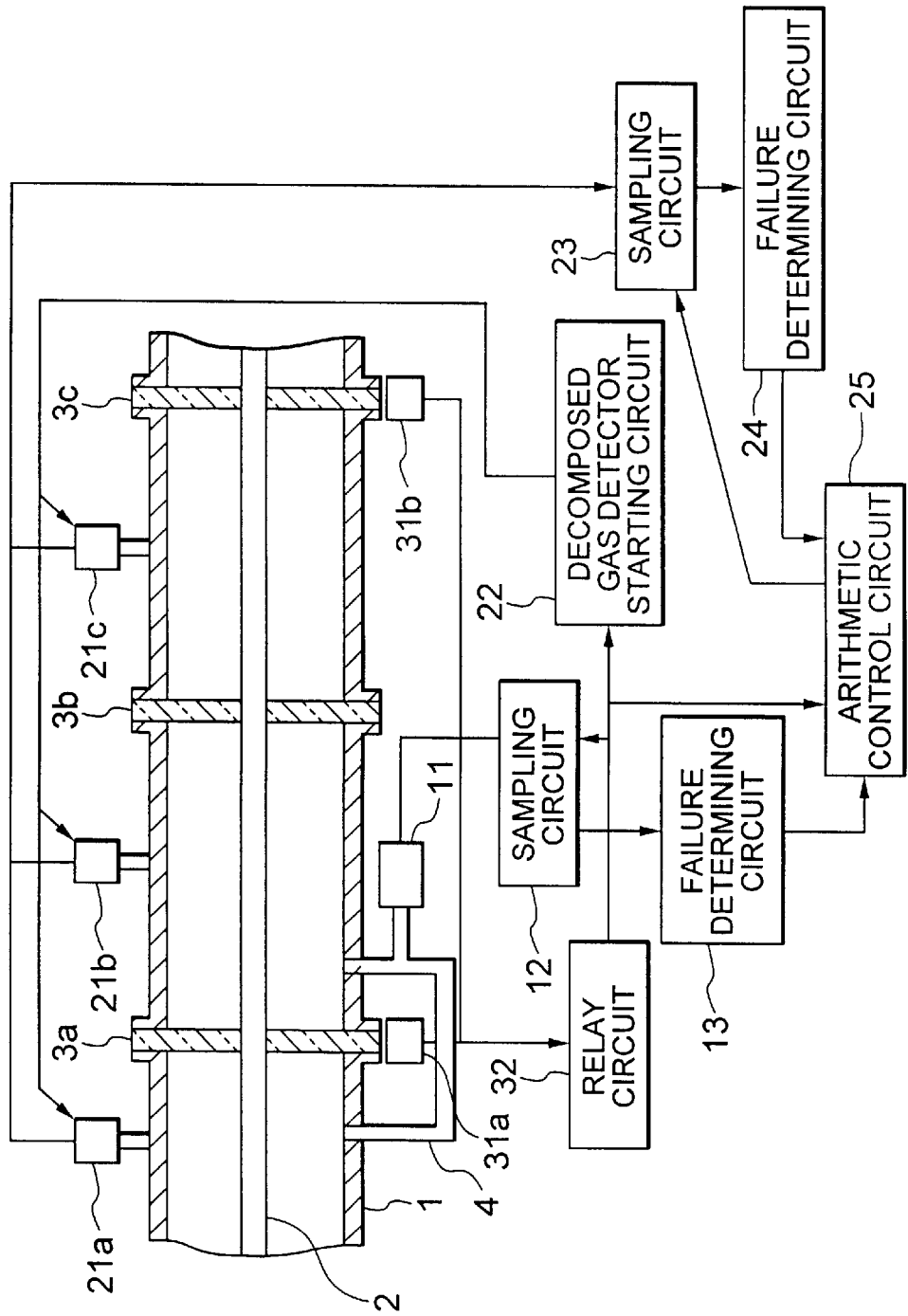
FIG. 10 shows the configuration of the failure determining apparatus of a gas-insulated electrical appliance of an embodiment 9 of the invention.

The failure determining apparatus of a gas-insulated electrical appliance of an embodiment 9 of the invention will now be described with reference to the drawing. FIG. 10 shows the configuration of the failure determining apparatus of a gas-insulated electrical appliance of the embodiment 9 of the invention.

In FIG. 10, 1 is a metal container of a gas-insulated electrical appliance; 2, a charged conductor; 3a to 3c, insulating spacers supporting the charged conductor 2; 4, a gas piping connecting the gas sections for communication; 11, a gas pressure detector; 12, a sampling circuit sampling an output signal of the gas pressure detector 11; 13, a failure determining circuit; 31a and 31b, photo-sensors; 32, a relay circuit for incorporating operating signals of the photo-sensors 31a and 31b; 21a to 21c, decomposed gas detectors installed for the individual gas blocks; 22, a decomposed gas detector starting circuit; 23, a sampling circuit sampling output signals of the decomposed gas detectors 21a to 21c; 24, a failure determining circuit for determining presence/absence from the decomposed gas concentration; and 25, an arithmetic control circuit for making determination on the basis of information of the gas pressure detector 11, the photo-sensors 31a and 31b, and the decomposed gas detectors 21a to 21c.

The operations of the failure determining apparatus of a gas-insulated electric appliance of the embodiment 9 will now be described with reference to the drawing.

When a ground-fault of the charged conductor 2 occurs with the metal container 1 in any of the gas sections formed by partitioning the metal container 1 with the insulating spacers 3a and 3b, an arc light is produced in the tank and leaks to outside through the insulating spacers 3a to 3c. Furthermore, the insulating gas pressure suddenly increases near the arc, leading to production of a pressure wave, and flows onto the static pressure side. The insulating gas is chemically decomposed by a high temperature resulting from arc energy, and a decomposed gas mainly comprising F ions is produced. The leakage light is introduced into the photo-sensors 31a and 31b to drive the relay circuit in response to an operating signal.

Simultaneously with this, the decomposed gas detector starting circuit 22 is started to supply power to the decomposed gas detectors 21a to 21c for all the gas blocks. Furthermore, occurrence of an accident is notified to the arithmetic control circuit 25.

The arithmetic control circuit 25 instructs the failure determining circuit 13 of the gas pressure detector 11 to compare the pressure before occurrence of the failure and the pressure upon the lapse of n seconds after occurrence of the failure. The signals detected by the gas pressure detector 11 are averaged by the sampling circuit 12, and then sent to the failure determining circuit 13 to determine presence/absence of a pressure difference of over the threshold value for each gas section. When a gas section of over the threshold value is detected, it is output as an accident occurring gas section to the arithmetic control circuit 25.

The arithmetic control circuit 25 instructs the sampling circuit 23 to sample decomposed gas data only for the gas section identified by the gas pressure detector 11.

The sampling circuit 23 averages only the output of the decomposed gas detectors 21 of the specified gas section, and sends it to the failure determining circuit 24, where the decomposed gas concentration is compared with the threshold value. Whether or not the threshold value is exceeded is output to the arithmetic control circuit 25.

When the gas section identified by the photo-sensors 31a and 31b agrees with that identified by the gas pressure detector 11, and the decomposed gas detector 21 of the specified gas block detects the decomposed gas having a concentration of over the threshold value, the arithmetic control circuit 25 determines occurrence of a ground-fault. By detecting different phenomena caused by ground-fault accidents by the respective detectors, there are available advantages of improving the accuracy of failure determination of an electrical appliance and reducing the time required for determining presence/absence of a failure.

More specifically, this embodiment 9 covers a failure determining apparatus of a gas-insulated electrical appliance in which a charged conductor 2 is housed in a cylindrical metal container 1, with the both ends of the metal container 1 partitioned by means of insulating spacers 3a to 3c, the charged conductor 2 being insulation-supported by the insulating spacers from the metal container, and gas blocks filled with an insulating gas in the metal container are connected as the gas sections; photo-sensors 31a and 31b for detecting an arc light leaking through the insulating spacers upon occurrence of a ground-fault or a short-circuit are attached to the insulating spacers confining the both ends of the metal container; a gas pressure detector 11 for detecting a change in the gas pressure is attached to each gas section; decomposed gas detectors 21a to 21c for detecting the ionized gas are attached to the individual gas blocks; the failure determining apparatus comprising a relay circuit 32 for incorporating operating signals of the photo-sensors; a sampling circuit 12 for fetching a change in the gas pressure from the gas pressure detector 11; a failure determining circuit 13 for determining a change in pressure in comparison with the threshold value; a decomposed gas detector starting circuit 22 for starting power-supply to the decomposed gas detector; a sampling circuit 23 for detecting the gas concentration from the decomposed gas detector; a failure determining circuit 24 for determining presence/absence of a decomposed gas in comparison with the threshold value; and an arithmetic control circuit 25 for determining occurrence of a ground-fault or a short-circuit when the gas section for which the photo-sensors have operated agrees with the gas section in which a pressure increase of over the threshold value has occurred, and a decomposed gas exceeding the threshold value is produced in a gas block within the same gas section; wherein the failure determining apparatus has a function of controlling the sampling circuit 23 so as to obtain an output of the decomposed gas detector only for the gas block within the gas section on the basis of the gas section information when the gas section for which the photo-sensors have operated agrees with the gas section in which a pressure increase of over the threshold value has occurred.

In the drawings showing the configuration of the above-mentioned embodiments, the attachment position of the detector relative to the gas section differs between the high-speed developing sensor 14 and the low-speed developing sensor 15, or between the gas pressure detector 11 and the decomposed gas detector 21. That is, for the same gas section, the-detectors are individually attached to the metal container 1. As a result, the internal gas pressure or a change in temperature or chemical composition would be measured at different points on the metal container. When carrying out calculation for determination of a failure using values obtained from the individual detectors, there is a problem of a lower reliability of the result of determination. Many gas supply and discharge ports or gas supply and discharge valves are required, resulting in a higher fabrication cost and parts cost. Another problem is that the detectors occupy large spaces. These problems are solved in the following embodiments.

Embodiment 10

Figure 11:
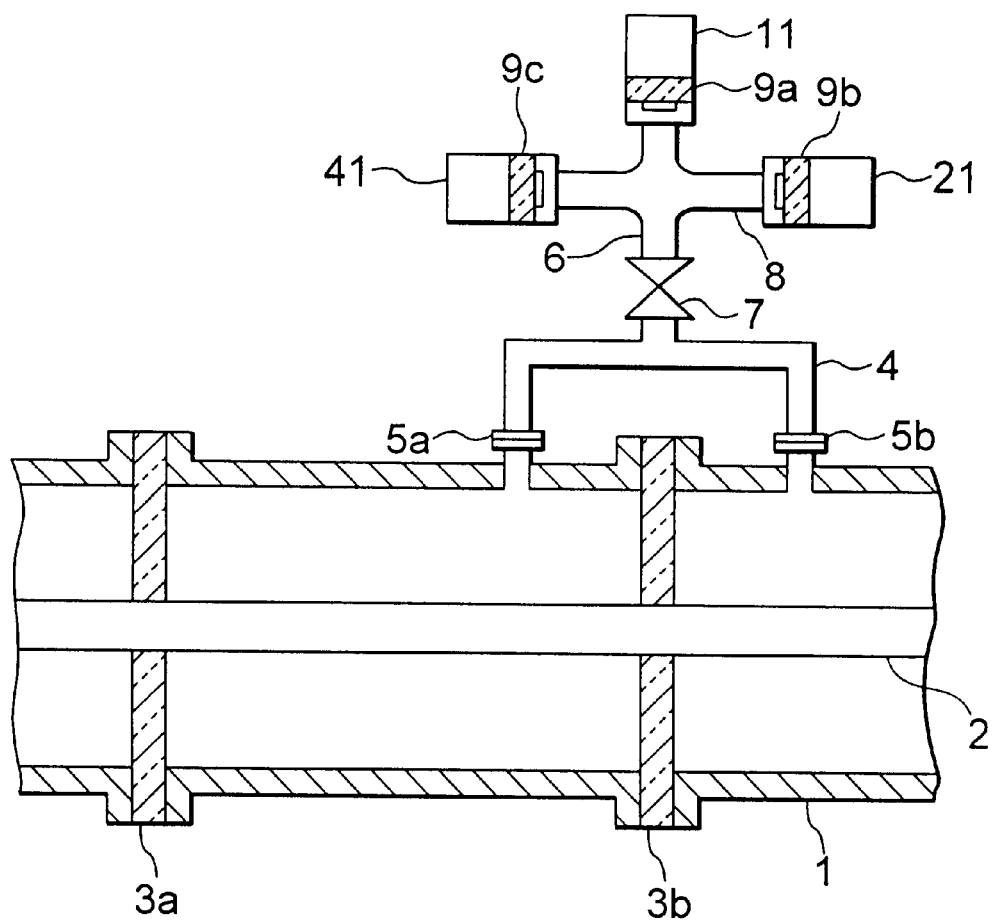
FIG. 11 is a configuration diagram showing the arrangement of attachment of the detectors in the failure determining apparatus of the gas-insulated electrical appliance of an embodiment 10 of the invention.

FIG. 11 is a configuration diagram showing the attachment arrangement of detectors in the failure determining apparatus of a gas-insulated electrical appliance of an embodiment 10 of the invention. In FIG. 11, 4 represents a communication piping attached in communication with the gas supply and discharge ports 5a and 5b of a gas section of the metal container; 6, a gas piping connected to the communication piping 4 via a gas supply/discharge valve 7, having a gas piping 8 branching therefrom. A gas pressure detector 11, a decomposed gas detector 21 and a temperature detector 41 are attached to the gas piping 8, respectively, via insulators 9a, 9b, and 9c having throughholes. The detecting sections of the aforementioned detectors 11, 21 and 41 are exposed to the gas to be measured via the throughholes. The detectors 11, 21, and 41 are attached to the same gas piping system, i.e., the gas piping 8 branching from the same gas piping 6, respectively.

The operations will now be described. The gas density is usually controlled, in the gas sections of the metal container 1, by detecting the gas pressure signal corresponding to the gas pressure by means of a gas pressure detector 11, and detecting the gas temperature by means of a temperature detector 41. Under abnormal conditions, in the gas sections of the metal container 1, occurrence of a ground-fault with the charged conductor 2 causes a sudden increase in the insulating gas pressure. Failure determination is therefore performed by detecting the pressure increase by means of the gas pressure detector 11, then, detecting the decomposed gas mainly comprising F ions produced by the high temperature of arc energy by means of the decomposed gas detector 21, and carrying out failure determination in this gas section by two different functions. The details of the operation are as described above as to the embodiment 3.

The detectors 11, 21 and 41 shown in FIG. 11 are attached, to the gas piping 8, respectively, branching from the same gas piping system, i.e., the same gas piping 6. Attachment of detectors to the same gas piping system as described above leads to a higher reliability of the result of determination, permit reduction of the number of the gas supply/discharge ports 5a and 5b, gas supply/discharge valves 7 or the gas piping, inhibition of the fabrication cost and the parts cost of the metal container 1, reduction of the occupied space, and improvement of the degree of freedom of layout of the gas-insulated electrical appliances.

Embodiment 11

Figure 12:
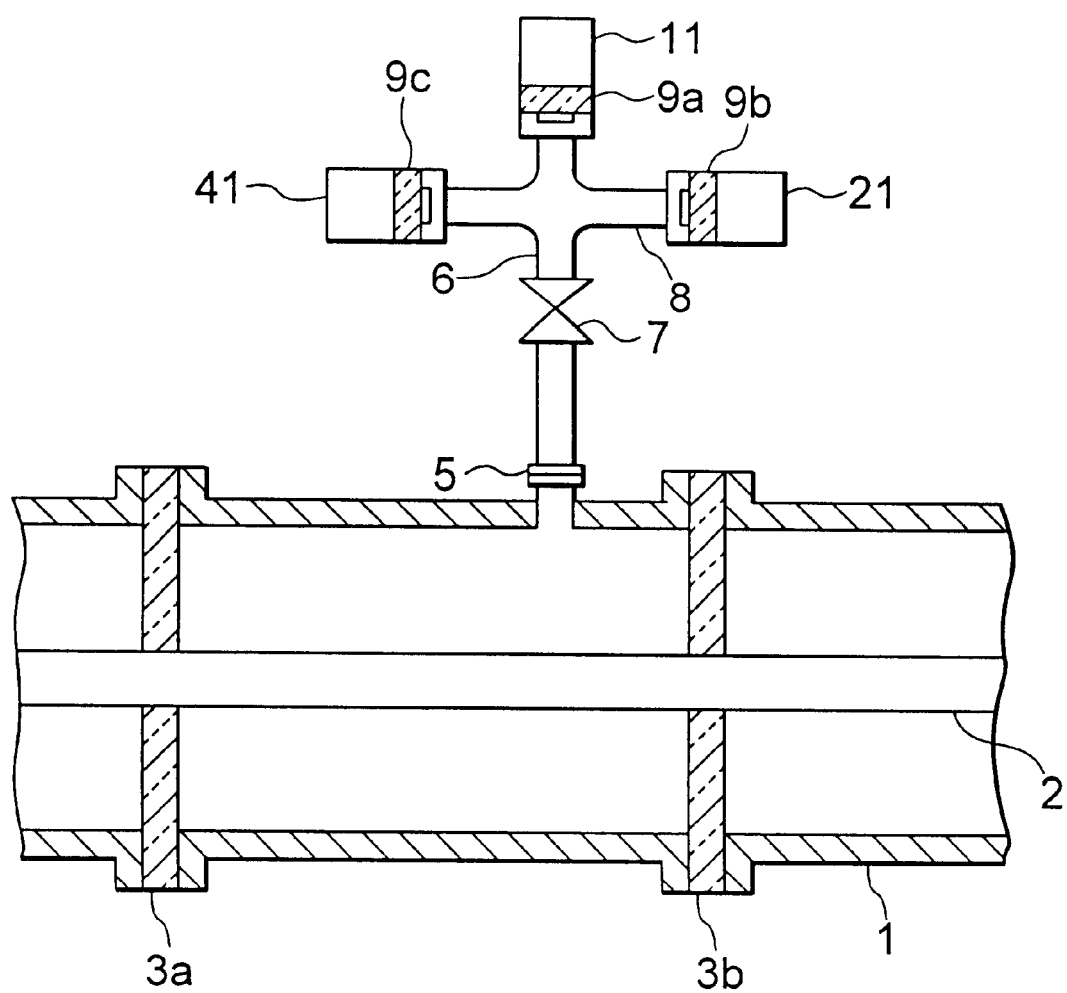
FIG. 12 is a configuration diagram showing the arrangement of attachment of the detectors in the failure determining apparatus of the gas-insulated electrical appliance of an embodiment 11 of the invention.

FIG. 12 is a configuration diagram showing the attachment arrangement of the detectors in the failure determining apparatus of a gas-insulated electrical appliance of an embodiment 11 of the invention. In FIG. 11, represents a gas supply/discharge port, which is provided for each gas section. FIG. 11, while showing the attachment condition of only one gas section, does not show the other gas sections. The gas piping 6 is connected to the gas supply/discharge port 5 via the gas supply/discharge valve 7. It is possible to attach the gas piping 6 to the gas supply/discharge port 5, and this gives the same advantages as in the embodiment 1.

Embodiment 12

Figure 13:
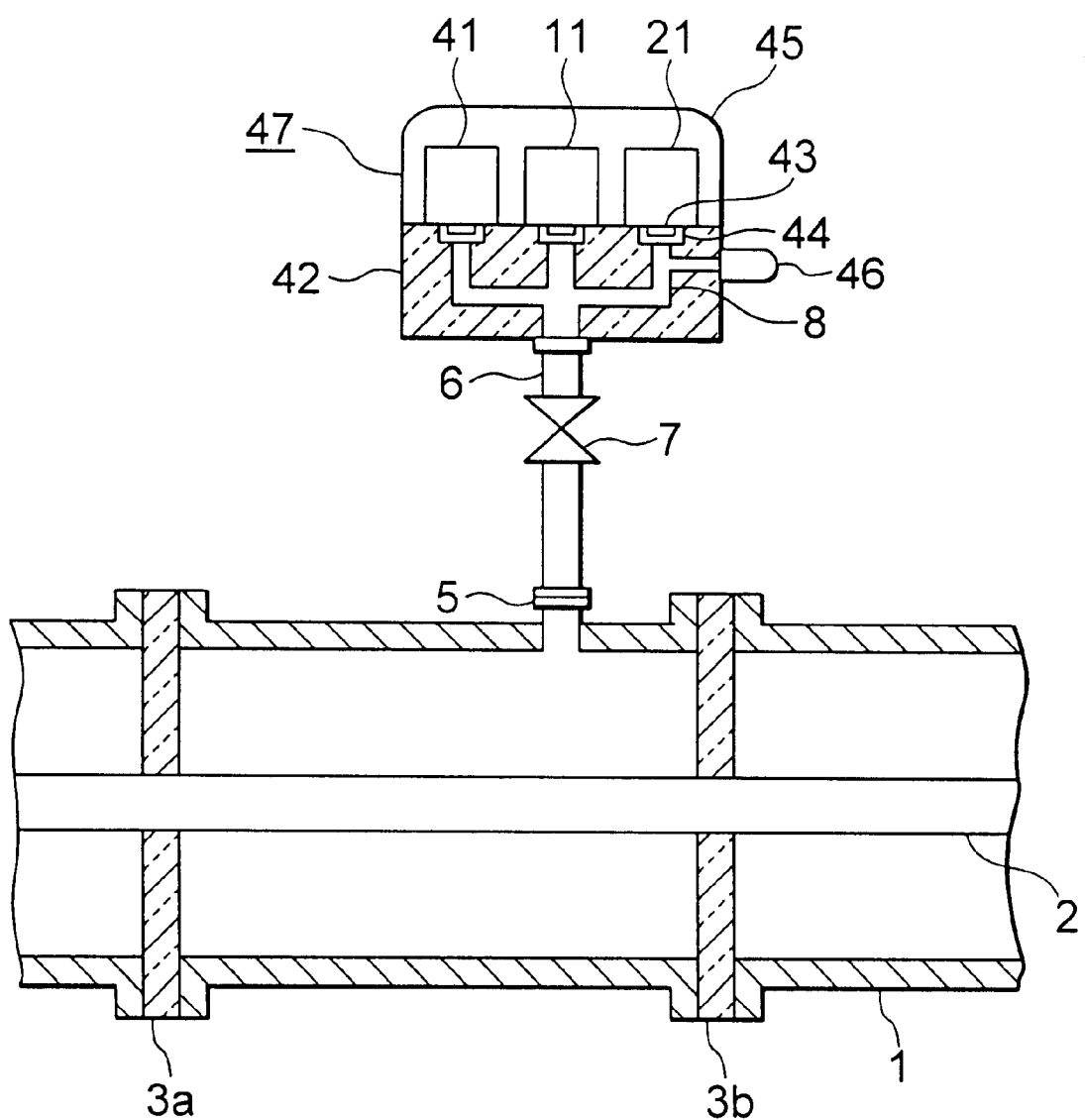
FIG. 13 is a configuration diagram showing the arrangement of attachment of the detectors in the failure determining apparatus of the gas-insulated electrical appliance of an embodiment 12 of the invention.

FIG. 13 is a configuration diagram showing arrangement of the attached detectors in the failure determining apparatus of a gas-insulated electrical appliance of an embodiment 12 of the invention. In FIG. 13, 42 represents an insulating detector mounting block which forms therein the gas piping 8 branching from the gas piping 6. A space 44 is provided in the insulating detector mounting block 42 so that the detecting sections 43 of all the detectors are exposed to the gas. The gas pressure detector 11, the decomposed gas detector 21 and the temperature detector 41 are mounted, respectively, on the gas piping 8. Electric insulation is maintained between the metal container land the individual detectors.

Also in FIG. 13, 45 represents a case housing the detectors there in and covers all the detectors so that they are integral. The case 45 is secured by bolts (not shown) to a mounting block 42. The reference numeral 46 represents a gas opening/closing valve provided at the exit of a piping communicating with the branched gas piping 8 and capable of releasing the gas contained. With the closed gas supply/discharge valve 7, opening of the gas opening/closing valve 46 permits discharge of the gas contained-in the detectors and the gas piping 6 and 8. The detectors 11, 21 and 41 mounted on the same insulating detector mounting block 42 are housed in the case 45 to achieve integrated detectors. They are attached, for each gas section of the metal container 1, via the gas piping 6, the gas supply/discharge valve 7, and the gas supply/discharge port 5. The failure determining circuit and the arithmetic control circuit are provided by and by outside the insulating detector mounting block 42 and the case 45.

The operations will now be described. The gas density is usually monitored, in the gas blocks of the metal container 1, by detecting a gas pressure signal corresponding to the gas pressure by means of the gas pressure detector 11, and detecting the gas temperature by means of the temperature detector 41 to convert the gas pressure into temperature in units of 25° C. Under abnormal conditions, in the gas section of the metal container 1, occurrence of a ground-fault with the charged conductor 2 causes a sudden increase in the insulating gas pressure. Failure determination for that gas section is accomplished by detecting the increase in pressure by means of the gas pressure detector 11, then detecting the decomposed gas mainly comprising F ions, produced by the high temperature resulting from arc energy, by means of the decomposed gas detector 21, and subjecting the result of detection to calculation processing.

By arranging the detectors on the same detector mounting block 42 made of an insulator, it is possible to keep electrical insulation of all the detectors, and to measure a change in gas status in the same gas piping system at a point on the metal container. When conducting calculation by using values obtained from the detectors, there is available a higher reliability of the result of failure determination. It is also possible to reduce the number of gas supply/discharge valves 7 or the gas piping, inhibit the fabrication cost or the parts cost of the metal container 1, and reduce the occupied space. By using the detector mounting block 42 made of an insulator, it is possible to reduce the gas path length from the metal container 1 to the detectors, and minimize changes in the state of gas, thus leading to an improved detection accuracy and an improved reliability of the result of failure determination.

By adopting the configuration in which a space 44 is provided and the detecting sections of the detectors can be incorporated into the detector mounting block 42, the detecting sections are reduced in size, leading to an improved degree of freedom of layout of the gas-insulated electrical appliance. Provision of the gas opening/closing valve 46, it is possible to carry out operational checkup of the detectors without the need to inject and discharge the insulating gas on the gas-insulated electrical appliance side, by closing the gas supply/discharge valve 5. By providing the case 45, the detecting sections can be protected from a shock in outdoor environment or from outside, and the detecting sections can be treated as an integral assembly, thus improving operability for attachment, removal and transportation.

In FIG. 13, the size of a concrete example of the failure determining apparatus of a gas-insulated electrical appliance is shown. The gas piping 6 has an inside diameter of 19 mm, and the monitoring apparatus of gas-insulated electrical appliance 47 is arranged near the metal container 1. The branch gas piping 8 is smaller in diameter than the gas piping 6, and the space 44 has an inside diameter larger than the gas piping 6. The insulating detector mounting block 42 having the detectors and the gas opening/closing valve and the case 45 together form the monitoring apparatus 47 for gas-insulated electrical appliance 47, and these components have total dimensions of a length of about 150 mm, a width of 100 mm, and a height of 120 mm. Of this height, the insulating detector mounting block 42 has a height of 50 mm. With this concrete example, it is possible to measure data such as pressure, concentration and temperature of a gas section of the metal container and carry out failure determination with the gas pressure detector 11, the decomposed gas detector 21, and the temperature detector 41.

Embodiment 13

Figure 14:
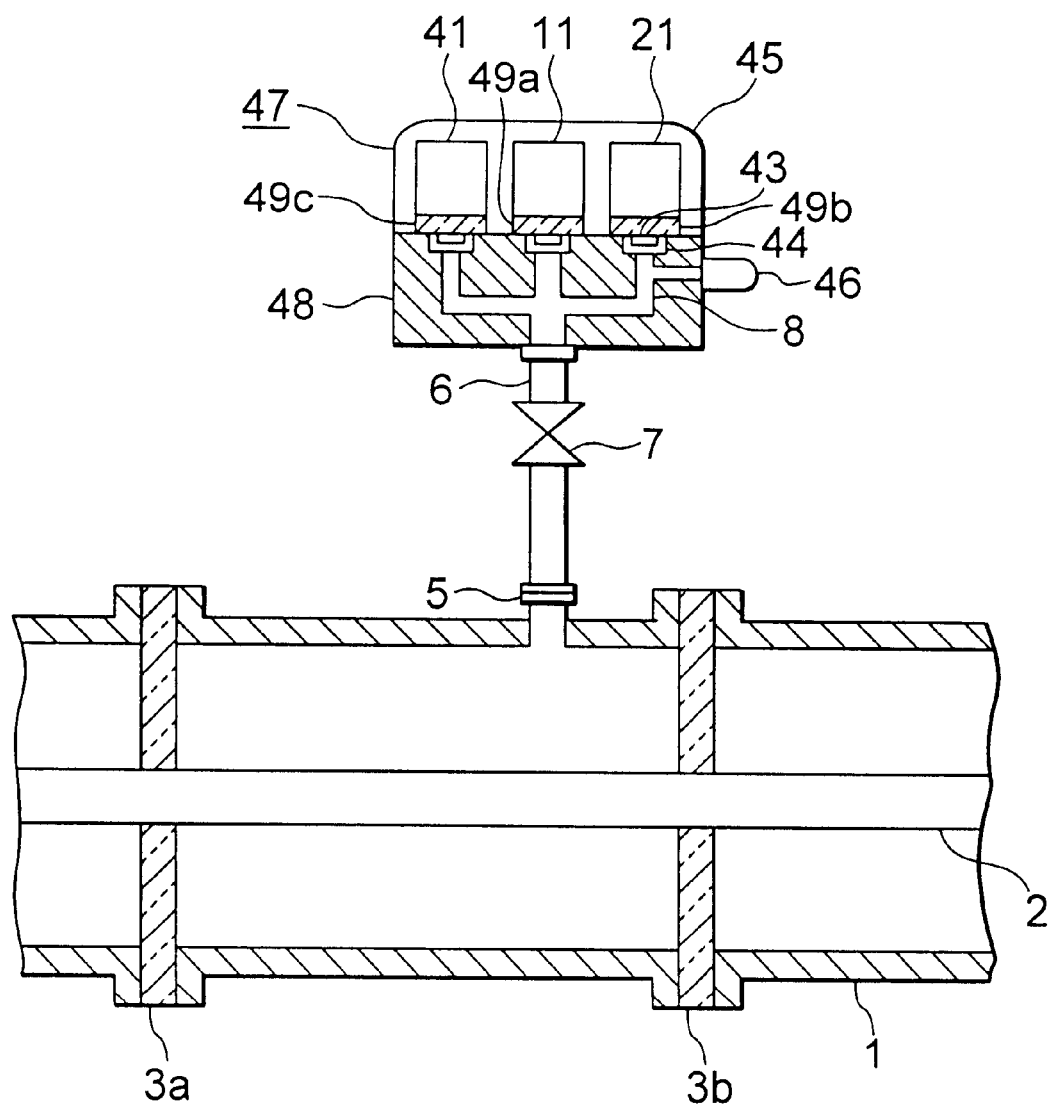
FIG. 14 is a configuration diagram showing the arrangement of attachment of the detectors in the failure determining apparatus of the gas-insulated electrical appliance of an embodiment 13 of the invention.

FIG. 14 is a configuration diagram showing the arrangement of attachment of the detectors in the failure determining apparatus of a gas-insulated electrical appliance of an embodiment 13 of the invention. In the monitoring apparatus for gas-insulated electrical appliance 47, a gas pressure detector 11, a decomposed gas detector 21, and a temperature detector 41 are arranged on the same metal detector mounting block 48 via insulators 49a, 49b and 49c, respectively. A gas piping 8 branched from a gas piping 6 is formed in the metal detector mounting block 48. A space 44 is provided in the metal detector mounting block 48 so as to expose the detecting sections 43 of the detectors are exposed to the gas, and the gas pressure detector 11, the decomposed gas detector 21, and the temperature detector 41 are mounted on the gas piping 8 via the insulators 49a, 49b and 49c, respectively. Electric insulation is kept with these insulators between the metal container 1 and the detectors. A gas opening/closing valve 46 is similarly provided. A case 45 houses these detectors and is secured by bolts (not shown) to the mounting block 48 to cover them. These features permit manufacture of the detecting sections at a low cost.

By adopting the aforementioned configuration, there are available the same advantages as in the embodiment 12. The insulators 49a, 49b and 49c may be made of the same insulating substrates.

Embodiment 14

Figure 15:
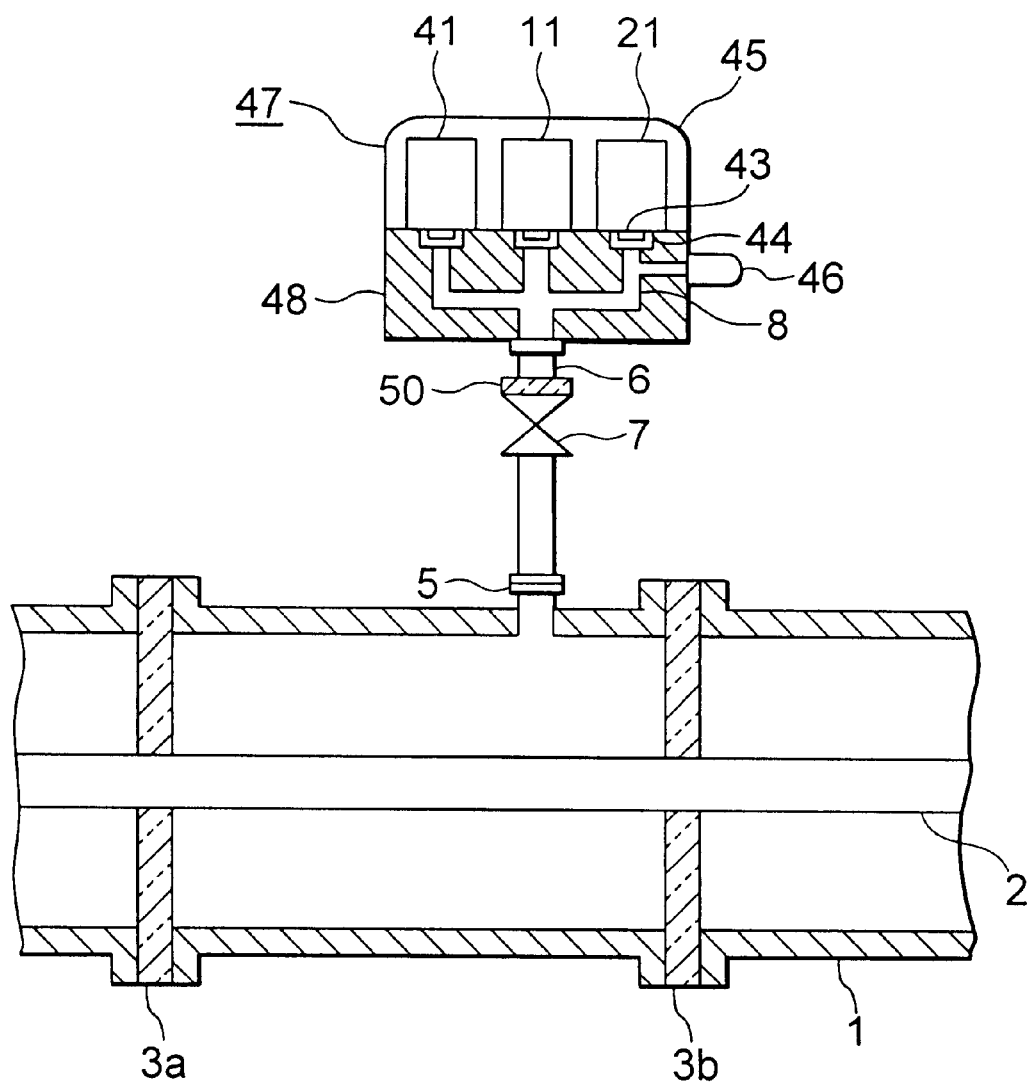
FIG. 15 is a configuration diagram showing the arrangement of attachment of the detectors in the failure determining apparatus of the gas-insulated electrical appliance of an embodiment 14 of the invention.

FIG. 15 is a configuration diagram showing arrangement of attached detectors in the failure determining apparatus of a gas-insulated electrical appliance of an embodiment 14 of the invention. In FIG. 15, 50 represents an insulator for insulating two components by providing, for example, between a metal detector mounting block 48 and a gas supply/discharge port 5, or between the gas piping 6 and a gas supply/discharge valve 7. It is thus possible to omit the insulator between the metal detector mounting block 48 and the detectors, reduce the number of insulators used, and minimize the parts cost.

Embodiment 15

Figure 16:
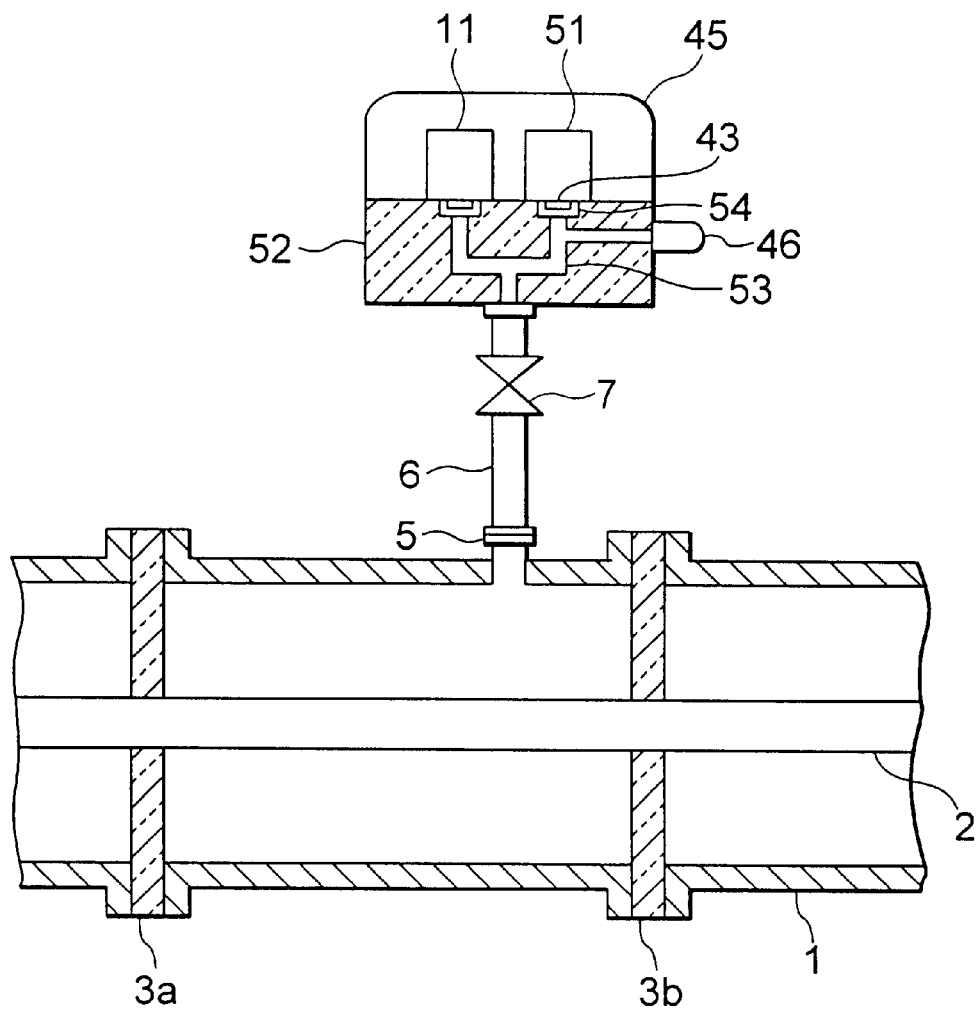
FIG. 16 is a configuration diagram showing the arrangement of attachment of the detectors in the failure determining apparatus of the gas-insulated electrical appliance of an embodiment 15 of the invention.

FIG. 16 is a configuration diagram showing the arrangement of attached detectors in the failure determining apparatus of an gas-insulated electrical appliance of an embodiment 15 of the invention. In FIG. 15, a temperature detector is incorporated into a decomposed gas detector to form a temperature/decomposed gas detector 51. This temperature/decomposed gas detector 51 and a gas pressure detector 11 are arranged on the same insulating detector mounting block 52. A gas piping 53 branched from a gas piping 6 is formed in the detector mounting block 52, and a space 54 for exposing the detecting sections of the detectors is formed. The reference numeral 46 represents a gas opening/closing valve. A case 45 covers all the detectors as in the embodiment 14.

By using the above-mentioned configuration, it is possible to reduce the number of detectors and reduce the cost of the detecting sections. It is also possible to reduce the size of the detectors, thus permitting improvement-of operability in attaching, removing and transporting, the further improvement of the degree of freedom of layout of the gas-insulated electrical appliances.

The gas supply/discharge value 7 may be directly attached to the gas supply/discharge port 5.

What is claimed is:

1. A failure determining apparatus of a gas-insulated electrical appliance determining a failure, having a cylindrical metal container, a charged conductor housed in said metal container filled with an insulating gas, and a plurality of insulating spacers insulation-supporting said charged conductor from said metal container and partitioning the interior of said metal container into gas sections, comprising:

a high-speed developing sensor which detects a high-speed phenomenon caused by a failure within said gas sections;

a first failure determining circuit which determines the presence of said failure from an output of said high-speed developing sensor;

a low-speed developing sensor which detects a low-speed phenomenon caused by said failure within said gas sections;

a second failure determining circuit which determines the presence of said failure from an output of said low-speed developing sensor; and an arithmetic control circuit that identifies a failure gas section of said metal container in which said failure occurs from an output of said first failure determining circuit and said second failure determining circuit.

2. A failure determining apparatus of a gas-insulated electrical appliance according to claim 1, wherein:

said high-speed developing sensor is a gas pressure detector which detects a change in the gas pressure of said gas sections;

and said low-speed developing sensor is a decomposed gas detector which detects a decomposed gas concentration of said gas sections, said failure determining apparatus further comprising:

a first sampling circuit which fetches the change in the gas pressure from said gas pressure detector on the basis of a failure current detection signal; and a second sampling circuit which fetches the decomposed gas concentration from said decomposed gas detector, wherein:

said first failure determining circuit determines a first accident occurring gas section when a change in gas pressure fetched by said first sampling circuit is over a first threshold value;

said second failure determining circuit determines a second accident occurring gas section when a decomposed gas concentration fetched by said second sampling circuit is over a second threshold value; and said arithmetic control circuit determines occurrence of said failure in said failure gas section of said metal container when said decomposed gas concentration exceeding said second threshold value occurs within said failure gas section in which an increase in pressure of over said first threshold value occurs, on the basis of output of determination of said first failure determining circuit and said second failure determining circuit.

3. A failure determining apparatus of a gas-insulated electrical appliance according to claim 2, further comprising:
a photo-sensor which detects an arc light leaking upon occurrence of a failure in said gas sections; and
a relay circuit which incorporates an operation signal of said photo-sensor;
wherein said arithmetic control circuit determines occurrence of said failure in said failure gas section of said metal container when said decomposed gas concentration of over said second threshold value occurs in said failure gas section in which a pressure increase of over said first threshold value has occurred, and said photo-sensor has operated in said failure gas section.

4. A failure determining apparatus of a gas-insulated electrical appliance according to claim 3, wherein:
said arithmetic control circuit controls said second sampling circuit so as to obtain said output of said decomposed gas detector only for specific ones of said gas sections on the basis of the gas section information sensed by said photo-sensor.

5. A failure determining apparatus of a gas-insulated electrical appliance according to claim 3, further comprising:
a decomposed gas detector starting circuit that causes said decomposed gas detector to begin to function.

6. A failure determining apparatus of a gas-insulated electrical appliance according to claim 2, wherein:
said arithmetic control circuit controls said second sampling circuit so as to obtain said output of said decomposed gas detector only for specific ones of said gas sections on the basis of gas section information as determined by said gas pressure detector.

7. A failure determining apparatus of a gas-insulated electrical appliance according to claim 2, further comprising:
a decomposed gas detector starting circuit that causes said decomposed gas detector to begin to function.

8. A failure determining apparatus of a gas-insulated electrical appliance according to claim 1, wherein:
said high-speed developing sensor is an impact gas pressure detector which detects an impact gas pressure of said gas sections; and
said low-speed developing sensor is a decomposed gas detector which detects a decomposed gas concentration in said gas sections, said failure determining apparatus further comprising:
a relay circuit which incorporates an operation signal of said impact gas pressure detector; and
a sampling circuit which fetches the decomposed gas concentration from said decomposed gas detector; wherein:
said second failure determining circuit determines an accident occurring gas section when the decomposed gas concentration fetched by said sampling circuit is over a prescribed threshold value; and
said arithmetic control circuit determines occurrence of said failure in said failure gas section of said metal container when there occurs said decomposed gas concentration exceeding said prescribed threshold value within said failure gas section for which said impact gas pressure detector has operated on the basis of an output of said relay circuit and said second failure determining circuit.

9. A failure determining apparatus of a gas-insulated electrical appliance according to claim 8, wherein:
said arithmetic control circuit controls said sampling circuit so as to obtain said output of said decomposed gas detector only for specific ones of said gas sections on the basis of gas section information as determined by said gas pressure detector.

10. A failure determining apparatus of a gas-insulated electrical appliance according to claim 8, further comprising:
a decomposed gas detector starting circuit that causes said decomposed gas detector to begin to function.

11. A failure determining apparatus of a gas-insulated electrical appliance according to claim 1, wherein:
said high-speed developing sensor is a photo-sensor which detects an arc light leaking upon occurrence of a failure in said gas sections; and
said low-speed developing sensor is a decomposed gas detector which detects a decomposed gas concentration of said gas sections, said failure determining apparatus further comprising:
a relay circuit which incorporates an operation signal of said photo-sensor; and
a sampling circuit which fetches the decomposed gas concentration from said decomposed gas detector; wherein:
said second failure determining circuit determines an accident occurring gas section when the decomposed gas concentration fetched by said sampling circuit is over a prescribed threshold value; and
said arithmetic control circuit determines occurrence of said failure in said failure gas section of said metal container when there occurs said decomposed gas concentration of over said prescribed threshold value within said failure gas section in which said photo-sensor has operated, on the basis of an output of said relay circuit and said second failure determining circuit.

12. A failure determining apparatus of a gas-insulated electrical appliance according to claim 11, wherein:
said arithmetic control circuit controls said sampling circuit so as to obtain said output of said decomposed gas detector only for specific ones of said gas sections on the basis of the gas section information sensed by said photo-sensor.

13. A failure determining apparatus of a gas-insulated electrical appliance according to claim 11, further comprising:
a decomposed gas detector starting circuit that causes said decomposed gas detector begin to function.

14. A failure determining apparatus of a gas-insulated electrical appliance determining a failure, having a metal container, a charged conductor housed in said metal container filled with an insulating gas, and a plurality of insulating spacers insulation-supporting said charged conductor from said metal container and partitioning the interior of said metal container into gas sections, comprising:
a gas pressure detector which detects the gas pressure of said gas section;
a first failure determining circuit which determines an accident occurring gas section when an output of the gas pressure detector is over a first threshold value;
a decomposed gas detector which detects a decomposed gas of said gas section;
a second failure determining circuit which determines an accident occurring gas section when an output of the decomposed gas detector is over a second threshold value; and an arithmetic control circuit which determines occurrence of a failure in said gas section of said metal container when a decomposed gas exceeding said second threshold value occurs within a gas section in which an increase in pressure of over said first threshold value occurs, on the basis of output of determination of said first and second failure determining circuits;

wherein said detectors are arranged in a single gas piping system derived from said gas section.

15. A failure determining apparatus of a gas-insulated electrical appliance according to claim 14, further comprising:
  a detector mounting block made of an insulator having therein a gas piping branching from a gas piping;
  a gas pressure detector and a decomposed gas detector attached to the branch gas piping of said mounting block, respectively; and
  a case secured to said block, covering these detectors.

16. A failure determining apparatus of a gas-insulated electrical appliance according to claim 14, further comprising:
  a block having therein a gas piping branching from a gas piping;
  a gas pressure detector and a decomposed gas detector attached to said branch gas piping of said block; and
  a case secured to said block, covering these detectors.

17. A failure determining apparatus of a gas-insulated electrical appliance according to claim 14, further comprising a temperature detector detecting the temperature of the insulating gas of a gas section mounted in the decomposed gas detector.

18. A failure determining apparatus of a gas-insulated electrical appliance determining a failure, having a cylindrical metal container, a charged conductor housed in said metal container filled with an insulating gas, and a plurality of insulating spacers insulation-supporting said charged conductor from said metal container and partitioning the interior of said metal container into gas sections, comprising:
  a plurality of high-speed developing sensors which detect a high-speed phenomenon caused by a failure within said gas sections;
  a first failure determining circuit connected to said plurality of high-speed developing sensors which determines the presence of said failure from an output of said high-speed developing sensors;
  a plurality of low-speed developing sensors which detect a low-speed phenomenon caused by said failure within said gas sections;
  a second failure determining circuit connected to said plurality of low-speed developing sensors which determines the presence of said failure from an output of said low-speed developing sensors; and
  an arithmetic control circuit connected to said first failure determining circuit and said second failure determining circuit that identifies which one of said gas sections of said metal container in which said failure occurs from an output of said first and second failure determining circuits.

19. A failure determining apparatus of a gas-insulated electrical appliance determining a failure, having a cylindrical metal container, a charged conductor housed in said metal container filled with an insulating gas, and a plurality of insulating spacers insulation-supporting said charged conductor from said metal container and partitioning the interior of said metal container into gas sections, comprising:
  a high-speed developing sensor means for detecting a high-speed phenomenon caused by a failure within said gas sections;
  a first failure determining circuit means for determining the presence of said failure from an output of said high-speed developing sensor;
  a low-speed developing sensor means for detecting a low-speed phenomenon caused by said failure within said gas sections;
  a second failure determining circuit means for determining the presence of said failure from an output of said low-speed developing sensor; and
  an arithmetic control circuit means for identifying a failure gas section of said metal container where said failure occurs from an output of said first failure determining circuit means and said second failure determining circuit means.

20. A failure determining apparatus of a gas-insulated electrical appliance according to claim 19, wherein:
  said high-speed developing sensor means is a gas pressure detector which detects a change in the gas pressure of said gas sections;
  and said low-speed developing sensor means is a decomposed gas detector which detects a decomposed gas concentration of said gas sections, said failure determining apparatus further comprising:
    a first sampling circuit means for fetching the change in the gas pressure from said gas pressure detector on the basis of a failure current detection signal; and
    a second sampling circuit means for fetching the decomposed gas concentration from said decomposed gas detector, wherein:
      said first failure determining circuit means determines a first accident occurring gas section when a change in gas pressure fetched by said first sampling circuit means is over a first threshold value;
      said second failure determining circuit means determines a second accident occurring gas section when a decomposed gas concentration fetched by said second sampling circuit means is over a second threshold value; and
      said arithmetic control circuit means determines occurrence of said failure in said failure gas section of said metal container when said decomposed gas concentration exceeding said second threshold value occurs within said failure gas section in which an increase in pressure of over said first threshold value occurs, on the basis of output of determination of said first failure determining circuit means and said second failure determining circuit means.

21. A failure determining apparatus of a gas-insulated electrical appliance according to claim 20, further comprising:
  a photo-sensor which detects an arc light leaking upon occurrence of a failure in said gas sections; and
  a relay circuit means which incorporates an operation signal of said photo-sensor;
  wherein said arithmetic control circuit means determines occurrence of said failure in said failure gas section of said metal container when said decomposed gas concentration of over said second threshold value occurs in said failure gas section in which a pressure increase of over said first threshold value has occurred, and said photo-sensor has operated in said failure gas section.

22. A failure determining apparatus of a gas-insulated electrical appliance according to claim 21, wherein:

said arithmetic control circuit means controls said second sampling circuit means so as to obtain said output of said decomposed gas detector only for specific ones of said gas sections on the basis of the gas section information sensed by said photo-sensor.

23. A failure determining apparatus of a gas-insulated electrical appliance according to claim 20, wherein:

said arithmetic control circuit means controls said second sampling circuit means so as to obtain said output of said decomposed gas detector only for specific ones of said gas sections on the basis of gas section information as determined by said gas pressure detector.

24. A failure determining apparatus of a gas-insulated electrical appliance according to claim 19, wherein:

said high-speed developing sensor means is an impact gas pressure detector which detects an impact gas pressure of said gas sections; and said low-speed developing sensor means is a decomposed gas detector which detects a decomposed gas concentration in said gas sections, said failure determining apparatus further comprising:

a relay circuit means for incorporating an operation signal of said impact gas pressure detector; and a sampling circuit means for fetching the decomposed gas concentration from said decomposed gas detector; wherein:

said second failure determining circuit means determines an accident occurring gas section when the decomposed gas concentration fetched by said sampling circuit means is over a prescribed threshold value; and said arithmetic control circuit means determines occurrence of said failure in said failure gas section of said metal container when there occurs said decomposed gas concentration exceeding said prescribed threshold value within said failure gas section for which said impact gas pressure detector has operated on the basis of an output of said relay circuit means and said second failure determining circuit means.

25. A failure determining apparatus of a gas-insulated electrical appliance according to claim 24, wherein:

said arithmetic control circuit means controls said sampling circuit means so as to obtain said output of said decomposed gas detector only for specific ones of said gas sections on the basis of gas section information as determined by said gas pressure detector.

26. A failure determining apparatus of a gas-insulated electrical appliance according to claim 19, wherein:

said high-speed developing sensor means is a photo-sensor which detects an arc light leaking upon occurrence of a failure in said gas sections; and said low-speed developing sensor means is a decomposed gas detector which detects a decomposed gas concentration of said gas sections, said failure determining apparatus further comprising:

a relay circuit means for incorporating an operation signal of said photo-sensor; and a sampling circuit means for fetching the decomposed gas concentration from said decomposed gas detector; wherein:

said second failure determining circuit means determines an accident occurring gas section when the decomposed gas concentration fetched by said sampling circuit is over a prescribed threshold value; and said arithmetic control circuit means determines occurrence of said failure in said failure gas section of said metal container when there occurs said decomposed gas concentration of over said prescribed threshold value within said failure gas section in which said photo-sensor has operated, on the basis of an output of said relay circuit and said second failure determining circuit.

27. A failure determining apparatus of a gas-insulated electrical appliance according to claim 26, wherein:

said arithmetic control circuit means controls said sampling circuit means so as to obtain said output of said decomposed gas detector only for specific ones of said gas sections on the basis of the gas section information sensed by said photo-sensor.

* * * * *